(12) United States Patent
Monro

(10) Patent No.: US 7,786,903 B2
(45) Date of Patent: Aug. 31, 2010

(54) COMBINATORIAL CODING/DECODING WITH SPECIFIED OCCURRENCES FOR ELECTRICAL COMPUTERS AND DIGITAL DATA PROCESSING SYSTEMS

(76) Inventor: Donald Martin Monro, 6, The Lays, Goose Street, Beckington, Somerset BA11 6RS (GB)

( * ) Notice: Subject to any disclaimer, the term of this patent is extended or adjusted under 35 U.S.C. 154(b) by 57 days.

(21) Appl. No.: 12/246,357

(22) Filed: Oct. 6, 2008

(65) Prior Publication Data

US 2010/0085219 A1 Apr. 8, 2010

(51) Int. Cl.
*H03M 5/00* (2006.01)
(52) U.S. Cl. .......................... 341/52; 341/50
(58) Field of Classification Search .......... 341/52, 341/51, 87, 106; 707/100; 708/203
See application file for complete search history.

(56) References Cited

U.S. PATENT DOCUMENTS

| | | | |
|---|---|---|---|
| 4,168,513 A | 9/1979 | Hains et al. | |
| 4,509,038 A | 4/1985 | Hirano | |
| 4,558,302 A | 12/1985 | Welch | |
| 4,675,809 A | 6/1987 | Omoda et al. | |
| 4,908,873 A | 3/1990 | Philbert et al. | |
| 5,218,435 A | 6/1993 | Lim et al. | |
| 5,315,670 A | 5/1994 | Shapiro | |
| 5,321,776 A | 6/1994 | Shapiro | |
| 5,365,237 A | 11/1994 | Johnson et al. | |
| 5,412,741 A | 5/1995 | Shapiro | |
| 5,539,207 A | 7/1996 | Wong | |
| 5,559,931 A | 9/1996 | Shindou et al. | |
| 5,585,852 A | 12/1996 | Agarwal | |
| 5,635,932 A | 6/1997 | Shinagawa et al. | |
| 5,699,121 A | 12/1997 | Zakhor et al. | |
| 5,748,786 A | 5/1998 | Zandi et al. | |
| 5,754,704 A | 5/1998 | Barnsley et al. | |
| 5,768,437 A | 6/1998 | Monro et al. | |
| 5,819,017 A | 10/1998 | Akeley et al. | |
| 5,873,076 A | 2/1999 | Barr et al. | |
| 5,910,999 A | 6/1999 | Mukohzaka | |
| 5,956,429 A | 9/1999 | Burns | |
| 6,029,167 A | 2/2000 | Evans | |

(Continued)

FOREIGN PATENT DOCUMENTS

CA   2539040 A1   3/2005

(Continued)

OTHER PUBLICATIONS

Anonymous, "Conversion Between Different Number Systems", Internet Article, [Online] Nov. 11, 2002, XP002494744, URL: http://www.cstc.org/data/resources/60/convexp.html>.

(Continued)

*Primary Examiner*—Rexford N Barnie
*Assistant Examiner*—Joseph Lauture
(74) *Attorney, Agent, or Firm*—Berkeley Law & Technology Group, LLP

(57) ABSTRACT

Embodiments described herein may include example embodiments of a method, article and apparatus for compressing data utilizing combinatorial coding with specified occurrences which may be used for communicating between two or more components connected to an interconnection medium (e.g., a bus) within a single computer or digital data processing system, and/or for communication between computing platforms via a network or other interconnection medium.

21 Claims, 4 Drawing Sheets

U.S. PATENT DOCUMENTS

| | | | |
|---|---|---|---|
| 6,037,883 A | 3/2000 | Forbes |
| 6,052,416 A | 4/2000 | Koga |
| 6,078,619 A | 6/2000 | Monro et al. |
| 6,086,706 A | 7/2000 | Brassil et al. |
| 6,125,348 A | 9/2000 | Levine |
| 6,144,835 A | 11/2000 | Inoue |
| 6,148,106 A | 11/2000 | Impagliazzo |
| 6,208,744 B1 | 3/2001 | Ishige et al. |
| 6,225,925 B1 | 5/2001 | Bengio et al. |
| 6,272,241 B1 | 8/2001 | Tattersall |
| 6,281,817 B2 | 8/2001 | Bengio et al. |
| 6,336,050 B1 | 1/2002 | Amin et al. |
| 6,353,244 B1 | 3/2002 | Yamazaki et al. |
| 6,373,411 B1 | 4/2002 | Shoham |
| 6,434,542 B1 | 8/2002 | Farmen et al. |
| 6,476,740 B1 | 11/2002 | Bengio et al. |
| 6,480,547 B1 | 11/2002 | Chen et al. |
| 6,489,902 B2 | 12/2002 | Heath |
| 6,522,785 B1 | 2/2003 | Kondo et al. |
| 6,549,148 B2 | 4/2003 | Satoh |
| 6,556,719 B1 | 4/2003 | Monro |
| 6,563,438 B2 | 5/2003 | Satoh |
| 6,587,507 B1 | 7/2003 | Chui |
| 6,614,847 B1 | 9/2003 | Das |
| 6,625,213 B2 | 9/2003 | Bottreau et al. |
| 6,654,503 B1 | 11/2003 | Sudharsanan |
| 6,661,839 B1 | 12/2003 | Ishida et al. |
| 6,703,596 B1 | 3/2004 | Moran |
| 6,707,400 B2 | 3/2004 | Christofferson et al. |
| 6,714,147 B2 | 3/2004 | Huber et al. |
| 6,747,736 B2 | 6/2004 | Takahashi |
| 6,777,684 B1 | 8/2004 | Volkov et al. |
| 6,782,132 B1 | 8/2004 | Fogg |
| 6,810,144 B2 | 10/2004 | McGee et al. |
| 6,816,605 B2 | 11/2004 | Rowe et al. |
| 6,820,079 B1 | 11/2004 | Evans |
| 6,847,966 B1 | 1/2005 | Sommer |
| 6,870,619 B1 | 3/2005 | Tenhunen et al. |
| 6,982,742 B2 | 1/2006 | Adair |
| 6,985,965 B2 | 1/2006 | Hannu et al. |
| 6,990,145 B2 | 1/2006 | Monro et al. |
| 7,003,039 B2 | 2/2006 | Zakhor et al. |
| 7,006,567 B2 | 2/2006 | Frossard |
| 7,015,837 B1 | 3/2006 | Malvar |
| 7,019,682 B1 | 3/2006 | Louberg et al. |
| 7,030,789 B1 | 4/2006 | Cideciyan et al. |
| 7,079,986 B2 | 7/2006 | Sieracki |
| 7,082,483 B2 | 7/2006 | Poo |
| 7,124,043 B2 | 10/2006 | Stein et al. |
| 7,147,153 B2 | 12/2006 | Rowe et al. |
| 7,155,445 B1 | 12/2006 | Kling et al. |
| 7,172,563 B2 | 2/2007 | Takiguchi et al. |
| 7,230,551 B2 | 6/2007 | Moriya et al. |
| 7,242,812 B2 | 7/2007 | Hwang |
| 7,265,691 B2 | 9/2007 | Tomic |
| 7,310,055 B2 | 12/2007 | Odagiri |
| 7,336,811 B2 | 2/2008 | Takeo |
| 7,340,013 B2 | 3/2008 | Ammer et al. |
| 7,352,298 B2 | 4/2008 | Monro |
| 7,436,884 B2 | 10/2008 | Chen |
| 7,508,325 B2 | 3/2009 | Monro |
| 7,511,638 B2 | 3/2009 | Monro |
| 7,511,639 B2 * | 3/2009 | Monro ........................ 341/51 |
| 7,518,538 B1 | 4/2009 | Schneider |
| 7,545,291 B2 | 6/2009 | Monro |
| 7,548,176 B2 | 6/2009 | Monro |
| 7,602,316 B2 | 10/2009 | Monro |
| 7,671,767 B2 | 3/2010 | Monro |
| 7,707,213 B2 | 4/2010 | Monro |
| 7,707,214 B2 | 4/2010 | Monro |
| 2002/0067480 A1 | 6/2002 | Takahashi |
| 2002/0069206 A1 | 6/2002 | Bergman et al. |
| 2002/0071594 A1 | 6/2002 | Kool et al. |
| 2003/0058943 A1 | 3/2003 | Zakhor et al. |
| 2003/0103523 A1 | 6/2003 | Frossard et al. |
| 2003/0108101 A1 | 6/2003 | Frossard et al. |
| 2003/0223621 A1 | 12/2003 | Rowe et al. |
| 2004/0028135 A1 | 2/2004 | Monro |
| 2004/0126018 A1 | 7/2004 | Monro |
| 2004/0165737 A1 | 8/2004 | Monro |
| 2004/0218836 A1 | 11/2004 | Kanatsu |
| 2004/0240712 A1 | 12/2004 | Rowe et al. |
| 2005/0043630 A1 | 2/2005 | Buchert |
| 2005/0049877 A1 | 3/2005 | Agranat |
| 2005/0084014 A1 | 4/2005 | Wang et al. |
| 2005/0149296 A1 | 7/2005 | Sieracki |
| 2005/0192516 A1 | 9/2005 | Takiguchi et al. |
| 2005/0092191 A1 | 10/2005 | Canon et al. |
| 2006/0054824 A1 | 3/2006 | Federici et al. |
| 2006/0064260 A1 | 3/2006 | Stein et al. |
| 2006/0097176 A1 | 5/2006 | Szu |
| 2006/0128311 A1 | 6/2006 | Tesfai |
| 2006/0255277 A1 | 11/2006 | Cole et al. |
| 2006/0273255 A1 | 12/2006 | Volkov et al. |
| 2007/0016414 A1 | 1/2007 | Mehrotra et al. |
| 2007/0029483 A1 | 2/2007 | James et al. |
| 2007/0030115 A1 | 2/2007 | Itsuji et al. |
| 2007/0030177 A1 | 2/2007 | Monro |
| 2007/0052558 A1 | 3/2007 | Monro |
| 2007/0053434 A1 | 3/2007 | Monro |
| 2007/0053597 A1 | 3/2007 | Monro |
| 2007/0053603 A1 | 3/2007 | Monro |
| 2007/0065034 A1 | 3/2007 | Monro |
| 2007/0164882 A1 | 7/2007 | Monro |
| 2007/0210956 A1 | 9/2007 | Hillis et al. |
| 2007/0237365 A1 | 10/2007 | Monro |
| 2007/0252733 A1 | 11/2007 | Thebault et al. |
| 2007/0258654 A1 | 11/2007 | Monro |
| 2007/0262257 A1 | 11/2007 | Monro |
| 2007/0271250 A1 | 11/2007 | Monro |
| 2007/0282933 A1 | 12/2007 | Monro |
| 2007/0290800 A1 | 12/2007 | Fuller |
| 2007/0290898 A1 | 12/2007 | Monro |
| 2007/0290899 A1 | 12/2007 | Monro |
| 2008/0005648 A1 | 1/2008 | Monro |
| 2008/0014580 A1 | 1/2008 | Alfano et al. |
| 2008/0056346 A1 | 3/2008 | Monro |
| 2008/0058619 A1 | 3/2008 | Monro |
| 2008/0084924 A1 | 4/2008 | Monro |
| 2008/0086519 A1 | 4/2008 | Monro |
| 2008/0097183 A1 | 4/2008 | Monro |
| 2008/0161674 A1 | 7/2008 | Monro |
| 2008/0205505 A1 | 8/2008 | Monro |
| 2008/0205523 A1 | 8/2008 | Monro |
| 2009/0016452 A1 | 1/2009 | Monro |
| 2009/0016453 A1 | 1/2009 | Monro |
| 2009/0019070 A1 | 1/2009 | Monro |
| 2009/0019071 A1 | 1/2009 | Monro |
| 2010/0085218 A1 | 4/2010 | Monro |
| 2010/0085221 A1 | 4/2010 | Monro |
| 2010/0085224 A1 | 4/2010 | Monro |

FOREIGN PATENT DOCUMENTS

| | | |
|---|---|---|
| DE | 10153407 A1 | 2/2003 |
| EP | 0595599 A2 | 5/1994 |
| EP | 0836325 A1 | 4/1998 |
| EP | 0939554 A2 | 9/1999 |
| EP | 1545010 A1 | 6/2005 |
| EP | 1610560 A1 | 12/2005 |
| EP | 1868005 A2 | 12/2007 |
| GB | 1488712 A | 10/1977 |
| GB | 2293733 A | 4/1996 |
| GB | 2311368 A | 9/1997 |

| | | | |
|---|---|---|---|
| GB | 2409943 A | 7/2005 | |
| JP | 60098335 A | 6/1985 | |
| JP | 2004265353 A | 9/2004 | |
| JP | 2005172775 A | 6/2005 | |
| RO | 70605 A2 | 5/1982 | |
| RU | 2066117 C1 | 9/1996 | |
| UA | 78022 C2 | 2/2007 | |
| WO | WO96/17546 A | 6/1996 | |
| WO | WO97/16029 | 5/1997 | |
| WO | WO98/11730 | 3/1998 | |
| WO | WO99/08449 | 2/1999 | |
| WO | WO01/15456 A1 | 3/2001 | |
| WO | WO01/48681 A2 | 7/2001 | |
| WO | WO01/63935 A1 | 8/2001 | |
| WO | WO02/13538 A1 | 2/2002 | |
| WO | WO02/084605 A2 | 10/2002 | |
| WO | WO2004/031954 A2 | 4/2004 | |
| WO | WO2004/051863 A1 | 6/2004 | |
| WO | WO2004/086939 A2 | 10/2004 | |
| WO | WO2005/026833 A3 | 3/2005 | |
| WO | WO2005/027049 A1 | 3/2005 | |
| WO | WO2005/064799 A1 | 7/2005 | |
| WO | WO2005/067661 A2 | 7/2005 | |
| WO | WO2005/092191 A1 | 10/2005 | |
| WO | WO2005/119581 A1 | 12/2005 | |
| WO | WO2006/082550 A1 | 8/2006 | |
| WO | WO2007/030702 A2 | 3/2007 | |
| WO | WO2007/030784 A2 | 3/2007 | |
| WO | WO2007/030785 A2 | 3/2007 | |
| WO | WO2007/030788 A2 | 3/2007 | |
| WO | PCT/US2007/008864 | 4/2007 | |
| WO | WO2007/084336 A2 | 7/2007 | |
| WO | WO2007/118219 A2 | 10/2007 | |
| WO | WO2007/118220 A2 | 10/2007 | |
| WO | WO2007/145875 A2 | 12/2007 | |
| WO | WO2007/149358 A1 | 12/2007 | |
| WO | WO2007/149383 A2 | 12/2007 | |
| WO | WO2007/149384 A2 | 12/2007 | |
| WO | WO2008/013704 A3 | 1/2008 | |
| WO | WO2008/027450 A2 | 3/2008 | |
| WO | WO2008/030425 | 3/2008 | |
| WO | WO2008/030426 A2 | 3/2008 | |
| WO | WO2008/030427 | 3/2008 | |
| WO | WO2008/045280 | 4/2008 | |
| WO | WO2008/045281 | 4/2008 | |
| WO | WO2008/085398 | 7/2008 | |
| WO | WO2008/103321 | 8/2008 | |
| WO | WO2008/103322 | 8/2008 | |
| WO | WO2008/103348 | 8/2008 | |
| WO | WO2008/143991 | 11/2008 | |
| WO | WO2009/009574 | 1/2009 | |
| WO | WO2009/009577 | 1/2009 | |
| WO | WO2009/009599 | 1/2009 | |
| WO | WO2009/009602 | 1/2009 | |

OTHER PUBLICATIONS

Bao, et. al, "A New Text Feature Extraction Model and its Application in Document Copy Detection", Machine Learning and Cybernetics, 2003, International Conference on Nov. 2-5, 2003, Piscataway, NJ, USA, IEEE, vol. 1, Nov. 2, 2003, pp. 82-87.

Bose, et. al, "Lee Distance Gray Codes", Information Theory, 1995, Proceedings 1995 IEEE International Symposium, Whistler, BC, Canada, Sep. 17-22, 1995, New York, NY, IEEE, US, Sep. 17, 1995, p. 236, XP010192708.

Brin, et. al, "Copy Detection Mechanisms for Digital Documents", Proceedings of the 1995 ACM SIGMOD International Conference on Management of Data SIGMOD '95, vol. 24, ACM Press, May 1995, pp. 398-409.

Cancedda, et. al, "Word Sequence Kernels", Mar. 2003, MIT Press, Journal of Medicine Learning Research, vol. 3, Special Edition, pp. 1059-1082.

Cotter, et. al, "Application of Tree-Based Searches to Matching Pursuit", 2001 IEEE International Conference on Acoustics, Speech, and Signal Processing, New York, NY, vol. 6, May 2001, pp. 3933-3936.

Cover, et. al, "Elements of Information Theory", Copyright Jon Wiley & Sons, Inc., p. 96, 1991.

Czerepinski, et. al, "Matching Pursuits Video Coding: Dictionaries and Fast Implementation" IEEE Trans Circuit Systems Video Technology, vol. 10, No. 7, pp. 1103-1115, Oct. 2000.

Database WPI Week 200547, Derwent Publications Ltd., London, GB; AN 2005-462389 & JP 2005-172775 (ZH Handotai Kenkyu Shinkokai) Jun. 30, 2005.

Daubechies, "Orthonormal Bases of Compactly Supported Wavelets", Comm. Pure Appl. Math., vol. 41, pp. 909-996, 1988.

DeNatale, et. al, A Mesh-Interpolation Scheme for Very-Low Bitrate Coding of Video Sequences, European Transactions on Telecommunications, vol. 9, No. 1, pp. 47-55, 1998.

DeVleeschouwer, et. al, "Subband Dictionaries for Low-cost Matching Pursuits of Video Residues", IEEE Transactions on Circuits and Systems for Video Technology, vol. 9, Issue 7, pp. 984-993, Oct. 1999.

Figueras, et. al, "Color Image Scalable Coding with Matching Pursuit", IEEE Int. Conference Acoustics Speech Signal Process, pp. III-53-56, May 2004.

Frossard, et. al, "High Flexibility Scalable Image Coding", Proceedings of VCIP 2003, Jul. 2003.

Gamito, et. al, "Lossless Coding of Floating Point Data with JPEG 2000 Part 10", Proceedings of the SPIE, SPIE, Bellingham, VA, US, vol. 5558, Aug. 2, 2004, pp. 276-287.

Globus, et. al, "Submillimeter-Wave Fourier Transform Spectroscopy of Biological Macromolecules", Journal of Applies Physics, vol. 91, No. 9, May 1, 2002, pp. 6105-6115.

Globus, et. al, "Terahertz Fourier Transform Characterization of Biological Materials in a Liquid Phase", Journal of Physics D. Applied Physics, Institute of Physics Publishing, Bristol, GB, vol. 39, No. 15, Aug. 7, 2006, pp. 3405-3413.

Golomb, S.B., "Run-length Encodings", IEEE Trans Information Theory, Jul. 1966, 12(3):399-401.

Horst, et. al, "Mupcos: A Multi-Purpose Coding Scheme", Signal Processing: Image Communication 5, pp. 75-89, 1993.

Hosang, M., "A Character Elimination Algorithm for Lossless Data Compression", Data Compression Conference, Proceedings DCC, IEEE Computer Society Press, Los Alamitos, CA, US, Apr. 2, 2002, pp. 1-10.

Huffman, David A., "A Method for the Construction of Minimum-Redundancy Codes", Pro. Inst. Radio Eng., 1952, 9(40), pp. 1098-1101.

Hull, Jonathan J., "Document Image Matching and Retrieval with Multiple Distortion Invariant Descriptors", International Association for Pattern Recognition Workshop on Document Analysis Systems, Series in Machine Perception and Artificial Intelligence, vol. 14, published by World Scientific Publishing Co. Pte. Ltd. 1995, pp. 379-396.

Ju, Jing, See "Millimeter Wave Absorption Spectroscopy of Biological Polymers", PhD Thesis, Stevens Institute of Technology, 92 pgs., 2001.

Larsson, N.J., "The Context Trees of Block Sorting Compression", In Proceedings of the IEEE Data Compression Conference, Snowbird, Utah, Mar. 30-Apr. 1, pp. 189-198, IEEE Computer Society Press, 1998.

Liu, et. al, "A Low-Cost Video Encoder with Matching Pursuit", Intelligent Multimedia, Video and Speech Processing, May 2, 2001, pp. 502-505.

Mallat, "A Theory for Multiresolution Signal Decomposition: The Wavelet Representation", IEEE Trans. Pattern Anal. Mach. Intel., vol. 11, No. 7, Jul. 1989.

Mallat, et. al, "Matching Pursuits with Time-Frequency Dictionaries", IEEE Trans. Signal Processing, vol. 41, No. 12, pp. 3397-3415, Dec. 1993.

Marusic, et. al, "A Matching Pursuit Enhanced Three-Dimensional Wavelet Transform Coder", Electrotechnical Conference, 2000, MELECON 2000, 10th Mediterranean, Publication Date: 2000, vol. 2, On pages 482-485.

Monro, "Basis Picking for Matching Pursuits Image Coding", IEEE International Conference on Image Processing, pp. 2495-2498, Sep. 2004.

Monro, et. al, "Alignment Blur in Coherently Averages Images", IEEE Transactions on Signal Processing, vol. 4, No. 6, pp. 1596-1601, Jun. 1996.

Monro, et. al, "Bases for Low Complexity Matching Pursuits Image Coding", Dept. of Electronic & Electrical Engineering., Bath University, UK, 2005, IEEE International Conference on Image Processing, Publication Date Sep. 11-14, 2005, vol. 2, pp. 249-252. www.http://dmsun4.bath.ac.uk.

Monro, et. al, "Improved Coding of Atoms in Matching Pursuits", IEEE Int. Conf. Image Process, vol. 2, Sep. 2003.

Monro, et. al, "Subband Adaptive Dictionaries for Wavelet/Matching Pursuits Image Coding", Oct. 8, 2006, Image Processing, p. 2136.

Monro, et. al, "Visual Embedding of Wavelet Transform Coefficients", IEEE International Conference Image Process, pp. 186-189, Sep. 2000.

Moschetti, et.al, "New dictionary and fast atom searching method for matching pursuit representation of displaced frame difference," in Proceedings of International Conference on Image Processing (ICIP '02), vol. 3, pp. 685-688, Rochester, NY, USA, Sep. 2002.

Neff, et. al, "Very Low Bit-Rate Video Coding Based on Matching Pursuits", IEEE Trans. Circuits and Systems for Video Tech., vol. 7, No. 1, pp. 158-171, Feb. 1997.

Neff, et. al, "Matching Pursuit Video Coding-Part I: Dictionary Approximation", IEEE Trans. Circuits System Video Technology, vol. 12, No. 1, pp. 13-26, Jan. 2002.

Park, et. al, "Lost Motion Vector Recovery Algorithm", Circuits and Systems, IEEE International Symposium on London, vol. 3, 1994, pp. 229-232.

Peng, et. al, "Matching Pursuits Low Bit Rate Video Coding with Codebooks Adaptation", Jun. 5, 2000, Acoustics, Speech, and Signal Processing, pp. 408-411.

Poh, et. al, "Comparison of Residual Compression Methods in Motion Compensated Video", IEEE Int. Workshop on Multimedia Signal Processing, pp. 109-112, Dec. 2002.

Rabiee, et. al, "Low-bit-rate Subband Image Coding with Matching Pursuits", Visual Communications and Image Processing, vol. 3309, 1998, pp. 875-880.

Rabiee, et. al, "Scalable Subband Image Coding with Segmented Orthogonal Matching Pursuit", Oct. 4, 1998, Image Processing, pp. 774-777.

Ramchandran, et. al, "Best Wavelet Packet Bases in a Rate-Distortion Sense", IEEE Transactions on Signal Processing, vol. 2, No. 2, pp. 160-175, Apr. 1993.

Rice, R.F., "Some Practical Universal Noiseless Coding Techniques", Jet Propulsion Laboratory, Pasadena, California, JPL Publication 79—Mar. 22, 1979.

Said, et. al, "A New, Fast, and Efficient Image Codec Based on Set Partitioning in Hierarchical Trees", IEEE Transactions on Circuits and Systems for Video Technology, vol. 5, No. 3, pp. 243-250, Jun. 1996.

Salomon, "Data Compression: The Complete Reference", Springer, XP002464409 pp. 32-33, 1998.

Sayood, Khalid, "Introduction to Data Compression", Morgan Kaufmann Publishers, Inc., San Francisco, CA, USA, 1996, pp. 27-32.

Sayood, Khalid, "Introduction to Data Compression", Morgan Kaufmann Publishers, Inc., San Francisco, CA, USA, 1996, pp. 98-99.

Schleimer, et. al, "Data Security Protection: Winnowing: Local Algorithms for Document Fingerprinting", 2003 ACM SIGMOD International Conference on Management of Data (SIGMOD '03), ACM Press, Jun. 2003, pp. 76-85.

Schmid-Saugeon, et. al, "Dictionary Design for Matching Pursuit and Application to Motion-Compensated Video Coding", 2004, IEEE Transactions on Circuits and Systems for Video Technology, pp. 880-886.

Sekharan, "Identification of Skull from its Suture Pattern", Forensic Science International, Mar. 1985, vol. 27, No. 3, pp. 205-214.

Shapiro, "Embedded Image Coding Using Zerotrees of Wavelet Coefficients", IEEE Transactions on Signal Processing, vol. 41, No. 12, pp. 3445-3462, Dec. 1993.

Shoa et. al, "Tree Structure Search for Matching Pursuit", Image Processing, 2005, vol. 3, 11, pp. 908-911.

Steffen, et. al, "Theory of Regular M-band Wavelet Bases", IEEE Transactions on Signal Processing, vol. 41, No. 12, pp. 3497-3511, Dec. 1993.

Teuhola, J., "A Compression Method for Clustered Bit-Vectors", Information Processing Letters, Amsterdam, NL, vol. 7, No. 6, pp. 308-311, Oct. 1978.

Tian, et. al, "Image Data Processing in the Compressed Wavelet Domain", Proceedings of ICSP '96, pp. 978-981, 1996.

Tredwell, et. al, "A Sequential Vector Selection Algorithm for Controllable Bandwidth Motion Description Encoding", IEEE Symposium Intell. Multimedia. Video & Speech Process, May 2001.

Trott, et. al, "Wavelets Applied to Lossless Compression and Progressive Transmission of Floating Point Data in 3-D Curvilinear Grids", IEEE Proceedings of the Visualization Conference, Oct. 27, 1996, 385-388.

Van Zandt, et. al, "Millimeter-Microwave Spectrum of DNA: Six Predictions for Spectroscopy", Phys. Rev. A, vol. 39, Issue 5, pp. 2672-2674, Mar. 1, 1989.

Woolard, et. al, "Millimeter Wave-Induced Vibrational Modes in DNA as a Possible Alternative to Animal Tests to Proble for Carcinogenic Mutations", Journal of Applied Toxicology, Wiley Heyden LTD, GB, vol. 17, No. 4, Aug. 1997, pp. 243-246.

Yuan, et. al, "3D Wavelet Video Coding with Replicated Matching Pursuits", Sep. 11, 2005, Image Processing, pp. 69-72.

Yuan, et. al, "Improved Matching Pursuits Image Coding", IEEE International Conference on Acoustics, Speech and Signal Processing ICASSP 2005, pp. II-201-204, Mar. 2005.

Yuan, et. al, "Low Complexity Separable Matching Pursuits", IEEE Int. Conference Acoustics Speech Signal Process, pp. III-725-728, May 2004.

Zhang, et. al, "A Hybrid Video Coder Based on H.264 with Matching Pursuits", Acoustics, Speech and Signal Processing, 2006, p. 889.

Zhang, et. al, "A Rate Estimation Framework for Matching Pursuits Video Coding", Journal of Multimedia, pp. 36-45, vol. 2, No. 3, Academy Publisher, Jun. 2007.

U.S. Appl. No. 11/222,656 / 20070065034: Jan. 19, 2010 Amendment, 18 pages.

U.S. Appl. No. 11/222,656 / 20070065034: Jan. 22, 2009 Amendment, 21 pages.

U.S. Appl. No. 11/222,656 / 20070065034: Feb. 18, 2010 Non-final office action, 19 pages.

U.S. Appl. No. 11/222,656 / 20070065034: Feb. 19, 2009 Final office action, 15 pages.

U.S. Appl. No. 11/222,656 / 20070065034: Apr. 16, 2009 Amendment, 17 pages.

U.S. Appl. No. 11/222,656 / 20070065034: Apr. 16, 2010 Examiner interview summary, 4 pages.

U.S. Appl. No. 11/222,656 / 20070065034: May 8, 2009 Advisory action, 4 pages.

U.S. Appl. No. 11/222,656 / 20070065034: Jul. 22, 2008 Non-final office action, 36 pages.

U.S. Appl. No. 11/222,656 / 20070065034: Aug. 19, 2009 RCE, 18 pages.

U.S. Appl. No. 11/222,656 / 20070065034: Oct. 19, 2009 Non-final office action, 17 pages.

U.S. Appl. No. 11/222,656 / 20070065034: Dec. 31, 2009 Office action appendix and Examiner interview summary, 7 pages.

U.S. Appl. No. 11/222,665 / 20070053597: Jan. 13, 2010 Examiner interview summary, 4 pages.

U.S. Appl. No. 11/222,665 / 20070053597: Jan. 22, 2010 Amendment, 11 pages.

U.S. Appl. No. 11/222,665 / 20070053597: Feb. 23, 2009 Final office action, 17 pages.

U.S. Appl. No. 11/222,665 / 20070053597: Mar. 9, 2010 Final office action, 15 pages.

U.S. Appl. No. 11/222,665 / 20070053597: Apr. 23, 2009 Amendment, 12 pages.

U.S. Appl. No. 11/222,665 / 20070053597: May 1, 2009 Advisory action, 3 pages.
U.S. Appl. No. 11/222,665 / 20070053597: May 21, 2009 RCE, 1 page.
U.S. Appl. No. 11/222,665 / 20070053597: Jul. 22, 2008 Non-final office action, 29 pages.
U.S. Appl. No. 11/222,665 / 20070053597: Jul. 23, 2009 Non-final office action, 16 pages.
U.S. Appl. No. 11/222,665 / 20070053597: Oct. 20, 2009 Examiner interview summary, 4 pages.
U.S. Appl. No. 11/222,665 / 20070053597: Nov. 22, 2009 Amendment, 13 pages.
U.S. Appl. No. 11/222,667 / 20070053434: Jan. 13, 2010 Examiner interview summary, 4 pages.
U.S. Appl. No. 11/222,667 / 20070053434: Jan. 26, 2009 Amendment, 14 pages.
U.S. Appl. No. 11/222,667 / 20070053434: Feb. 3, 2010 Amendment, 12 pages.
U.S. Appl. No. 11/222,667 / 20070053434: Feb. 23, 2009 Final office action, 20 pages.
U.S. Appl. No. 11/222,667 / 20070053434: Mar. 17, 2010 Examiner interview summary, 3 pages.
U.S. Appl. No. 11/222,667 / 20070053434: Mar. 24, 2010 Final office action, 15 pages.
U.S. Appl. No. 11/222,667 / 20070053434: Apr. 14, 2010 Examiner interview summary, 4 pages.
U.S. Appl. No. 11/222,667 / 20070053434: Apr. 23, 2009 Amendment, 11 pages.
U.S. Appl. No. 11/222,667 / 20070053434: Jul. 24, 2008 Non-final office action, 29 pages.
U.S. Appl. No. 11/222,667 / 20070053434: Aug. 24, 2009 RCE with amendment, 11 pages.
U.S. Appl. No. 11/222,667 / 20070053434: Nov. 3, 2009 Nonfinal office action, 17 pages.
U.S. Appl. No. 11/222,670 / 20070053603: Jan. 13, 2010 Examiner interview summary, 4 pages.
U.S. Appl. No. 11/222,670 / 20070053603: Jan. 22, 2009 Amendment, 13 pages.
U.S. Appl. No. 11/222,670 / 20070053603: Feb. 8, 2010 RCE with amendment, 14 pages.
U.S. Appl. No. 11/222,670 / 20070053603: Feb. 23, 2009 Non-final office action, 21 pages.
U.S. Appl. No. 11/222,670 / 20070053603: Mar. 24, 2010 Non-final office action, 18 pages.
U.S. Appl. No. 11/222,670 / 20070053603: Jul. 23, 2008 Non-final office action, 30 pages.
U.S. Appl. No. 11/222,670 / 20070053603: Aug. 24, 2009 Amendment, 10 pages.
U.S. Appl. No. 11/222,670 / 20070053603: Oct. 7, 2009 Final office action, 18 pages.
U.S. Appl. No. 11/255,090 / 20070271250: Jan. 14, 2010 Advisory action and affidavits, 4 pages.
U.S. Appl. No. 11/255,090 / 20070271250: Jan. 16, 2009 Examiner interview summary, 4 pages.
U.S. Appl. No. 11/255,090 / 20070271250: Feb. 6, 2008 Non-final office action, 20 pages.
U.S. Appl. No. 11/255,090 / 20070271250: Feb. 22, 2010 Notice of appeal and prebrief conference request, 7 pages.
U.S. Appl. No. 11/255,090 / 20070271250: Feb. 27, 2009 Amendment, 14 pages.
U.S. Appl. No. 11/255,090 / 20070271250: Apr. 21, 2010 Prebrief appeal conference decision, 2 pages.
U.S. Appl. No. 11/255,090 / 20070271250: May 6, 2008 Amendment, 11 pages.
U.S. Appl. No. 11/255,090 / 20070271250: Jun. 25, 2009 Amendment, 15 pages.
U.S. Appl. No. 11/255,090 / 20070271250: Sep. 3, 2008 Final office action, 29 pages.
U.S. Appl. No. 11/255,090 / 20070271250: Oct. 20, 2009 Final office action, 18 pages.
U.S. Appl. No. 11/255,090 / 20070271250: Oct. 31, 2008 Amendment, 13 pages.
U.S. Appl. No. 11/255,090 / 20070271250: Nov. 14, 2008 Advisory action, 3 pages.
U.S. Appl. No. 11/255,090 / 20070271250: Dec. 3, 2008 RCE with amendment, 21 pages.
U.S. Appl. No. 11/255,090 / 20070271250: Dec. 9, 2009 Amendment, 16 pages.
U.S. Appl. No. 11/255,090 / 20070271250: Dec. 15, 2008 Non-final office action, 18 pages.
U.S. Appl. No. 11/255,090 / 20070271250: Dec. 15, 2009 Advisory action and affidavits, 4 pages.
U.S. Appl. No. 11/255,090 / 20070271250: Dec. 29, 2009 Amendment, 16 pages.
U.S. Appl. No. 11/332,777 / 20070164882: Feb. 18, 2010 Prebrief conference decision, 2 pages.
U.S. Appl. No. 11/332,777 / 20070164882: Feb. 18, 2010 Prebrief conference decision, 4 pages.
U.S. Appl. No. 11/332,777 / 20070164882: Feb. 26, 2009 Non-final office action, 15 pages.
U.S. Appl. No. 11/332,777 / 20070164882: Mar. 18, 2010 Appeal brief, 30 pages.
U.S. Appl. No. 11/332,777 / 20070164882: Mar. 31, 2009 Examiner interview summary, 8 pages.
U.S. Appl. No. 11/332,777 / 20070164882: May 7, 2009 Amendment, 22 pages.
U.S. Appl. No. 11/332,777 / 20070164882: May 21, 2008 Amendment, 24 pages.
U.S. Appl. No. 11/332,777 / 20070164882: Aug. 7, 2009 Final office action, 16 pages.
U.S. Appl. No. 11/332,777 / 20070164882: Aug. 13, 2008 Final office action, 24 pages.
U.S. Appl. No. 11/332,777 / 20070164882: Oct. 14, 2008 Amendment, 20 pages.
U.S. Appl. No. 11/332,777 / 20070164882: Oct. 24, 2008 Advisory action, 7 pages.
U.S. Appl. No. 11/332,777 / 20070164882: Oct. 27, 2009 Amendment, 21 pages.
U.S. Appl. No. 11/332,777 / 20070164882: Nov. 3, 2009 Advisory action, 7 pages.
U.S. Appl. No. 11/332,777 / 20070164882: Dec. 7, 2009 Notice of appeal and prebrief conference request, 7 pages.
U.S. Appl. No. 11/332,777 / 20070164882: Dec. 15, 2008 RCE with amendment, 22 pages.
U.S. Appl. No. 11/332,777 / 20070164882: Dec. 21, 2007 Non-final office action, 9 pp.
U.S. Appl. No. 11/378,662 / 20070052558: Feb. 5, 2010 Non-final office action, 23 pages.
U.S. Appl. No. 11/378,662 / 20070052558: Mar. 30, 2009 Amendment, 13 pages.
U.S. Appl. No. 11/378,662 / 20070052558: Jun. 20, 2008 Non-final office action, 29 pages.
U.S. Appl. No. 11/378,662 / 20070052558: Jul. 8, 2009 Final office action, 19 pages.
U.S. Appl. No. 11/378,662 / 20070052558: Sep. 8, 2009 Amendment, 12 pages.
U.S. Appl. No. 11/378,662 / 20070052558: Sep. 22, 2008 Amendment, 14 pages.
U.S. Appl. No. 11/378,662 / 20070052558: Sep. 23, 2009 Advisory action, 4 pages.
U.S. Appl. No. 11/378,662 / 20070052558: Oct. 8, 2009 RCE with amendment, 13 pages.
U.S. Appl. No. 11/378,662 / 20070052558: Dec. 29, 2008 Non-final office action, 23 pages.
U.S. Appl. No. 11/399,752 / 20070237365: Jan. 14, 2010 Non-final office action, 15 pages.
U.S. Appl. No. 11/399,752 / 20070237365: Mar. 17, 2010 Amendment, 13 pages.
U.S. Appl. No. 11/399,752 / 20070237365: Aug. 25, 2009 Non-final office action, 35 pages.
U.S. Appl. No. 11/399,752 / 20070237365: Oct. 28, 2008 Preliminary amendment, 9 pages.
U.S. Appl. No. 11/399,752 / 20070237365: Oct. 29, 2009 Amendment, 14 pages.

U.S. Appl. No. 11/399,752 / 20070237365: Dec. 10, 2007 Preliminary amendment, 7 pages.
U.S. Appl. No. 11/399,753 / 20070258654: Mar. 9, 2010 Amendment, 16 pages.
U.S. Appl. No. 11/399,753 / 20070258654: Apr. 29, 2009 Preliminary amendment, 11 pages.
U.S. Appl. No. 11/399,753 / 20070258654: May 30, 2008 Preliminary amendment, 11 pages.
U.S. Appl. No. 11/399,753 / 20070258654: Jun. 2, 2009 Non-final office action, 46 pages.
U.S. Appl. No. 11/399,753 / 20070258654: Aug. 13, 2009 Amendment, 14 pages.
U.S. Appl. No. 11/399,753 / 20070258654: Dec. 10, 2009 Non-final office action, 35 pages.
U.S. Appl. No. 11/425,137 / 20080005648: Feb. 26, 2010 RCE with amendment, 10 pages.
U.S. Appl. No. 11/425,137 / 20080005648: Mar. 29, 2010 Notice of allowance, 16 pages.
U.S. Appl. No. 11/425,137 / 20080005648: May 26, 2009 Non-final office action, 36 pages.
U.S. Appl. No. 11/425,137 / 20080005648: Aug. 25, 2009 Amendment, 16 pages.
U.S. Appl. No. 11/425,137 / 20080005648: Dec. 1, 2009 Notice of allowance, 14 pages.
U.S. Appl. No. 11/425,137 / 20080005648: Dec. 26, 2007 Preliminary amendment, 16 pages.
U.S. Appl. No. 11/425,138 / 20070290898: Feb. 7, 2008 Preliminary amendment, 20 pages.
U.S. Appl. No. 11/425,138 / 20070290898: Feb. 19, 2010 Non-final office action, 32 pages.
U.S. Appl. No. 11/425,142 / 20070290899: Jan. 16, 2008 Notice of allowance, 25 pages.
U.S. Appl. No. 11/425,142 / 20070290899: Mar. 2, 2009 Final office action, 33 pages.
U.S. Appl. No. 11/425,142 / 20070290899: Mar. 18, 2010 Final office action, 36 pages.
U.S. Appl. No. 11/425,142 / 20070290899: Mar. 20, 2007 Non-final office action, 18 pages.
U.S. Appl. No. 11/425,142 / 20070290899: Apr. 15, 2008 RCE with amendment, 15 pages.
U.S. Appl. No. 11/425,142 / 20070290899: Apr. 29, 2009 Amendment, 17 pages.
U.S. Appl. No. 11/425,142 / 20070290899: May 16, 2008 Notice of allowance, 35 pages.
U.S. Appl. No. 11/425,142 / 20070290899: May 21, 2009 Advisory action, 3 pages.
U.S. Appl. No. 11/425,142 / 20070290899: Jun. 9, 2009 RCE with amendment, 2 pages.
U.S. Appl. No. 11/425,142 / 20070290899: Jun. 20, 2007 Amendment, 14 pages.
U.S. Appl. No. 11/425,142 / 20070290899: Jul. 31, 2008 RCE, 1 page.
U.S. Appl. No. 11/425,142 / 20070290899: Aug. 4, 2009 Non-final office action, 33 pages.
U.S. Appl. No. 11/425,142 / 20070290899: Sep. 16, 2008 Non-final office action, 30 pages.
U.S. Appl. No. 11/425,142 / 20070290899: Sep. 18, 2007 Final office action, 24 pages.
U.S. Appl. No. 11/425,142 / 20070290899: Oct. 17, 2007 Notice of allowance, 2 pages.
U.S. Appl. No. 11/425,142 / 20070290899: Oct. 20, 2009 Amendment, 15 pages.
U.S. Appl. No. 11/425,142 / 20070290899: Nov. 27, 2007 RCE with amendment, 13 pages.
U.S. Appl. No. 11/425,142 / 20070290899: Dec. 16, 2008 Amendment, 15 pages.
U.S. Appl. No. 11/433,073 / 20070262257: Feb. 13, 2009 Notice of abandonment, 2 pages.
U.S. Appl. No. 11/433,073 / 20070262257: Mar. 10, 2008 Non-final office action, 22 pages.
U.S. Appl. No. 11/433,073 / 20070262257: May 8, 2008 Amendment, 18 pages.
U.S. Appl. No. 11/433,073 / 20070262257: Jul. 24, 2008 Final office action, 27 pages.
U.S. Appl. No. 11/433,073 / 20070262257: Sep. 23, 2008 Amendment, 21 pages.
U.S. Appl. No. 11/433,073 / 20070262257: Nov. 28, 2008 Advisory action, 4 pages.
U.S. Appl. No. 11/433,073 / 20070262257: Dec. 26, 2007 Preliminary amendment, 15 pages.
U.S. Appl. No. 11/469,198 / 20080056346: Feb. 14, 2010 Issue fee payment, 1 page.
U.S. Appl. No. 11/469,198 / 20080056346: Mar. 10, 2010 Issue notification, 1 page.
U.S. Appl. No. 11/469,198 / 20080056346: Apr. 25, 2008 Preliminary amendment, 52 pages.
U.S. Appl. No. 11/469,198 / 20080056346: Sep. 4, 2009 Non-final office action, 44 pages.
U.S. Appl. No. 11/469,198 / 20080056346: Sep. 24, 2009 Amendment, 27 pages.
U.S. Appl. No. 11/469,198 / 20080056346: Nov. 2, 2009 Final office action, 13 pages.
U.S. Appl. No. 11/469,198 / 20080056346: Nov. 13, 2009 Amendment and terminal disclaimer, 21 pages.
U.S. Appl. No. 11/469,198 / 20080056346: Dec. 1, 2009 Notice of allowance, 16 pages.
U.S. Appl. No. 11/470,609 / 20080058619: Jan. 9, 2009 Amendment, 22 pages.
U.S. Appl. No. 11/470,609 / 20080058619: Jan. 20, 2010 Final office action, 27 pages.
U.S. Appl. No. 11/470,609 / 20080058619: Feb. 16, 2010 Examiner interview summary, 3 pages.
U.S. Appl. No. 11/470,609 / 20080058619: Mar. 18, 2010 RCE with amendment, 13 pages.
U.S. Appl. No. 11/470,609 / 20080058619: Apr. 7, 2010 Notice of allowance, 17 pages.
U.S. Appl. No. 11/470,609 / 20080058619: Apr. 28, 2008 Preliminary amendment, 36 pages.
U.S. Appl. No. 11/470,609 / 20080058619: Apr. 28, 2009 Final office action 17 pages.
U.S. Appl. No. 11/470,609 / 20080058619: Jun. 17, 2009 Amendment, 13 pages.
U.S. Appl. No. 11/470,609 / 20080058619: Jun. 30, 2009 Non-final office action, 15 pages.
U.S. Appl. No. 11/470,609 / 20080058619: Sep. 23, 2009 Amendment, 12 pages.
U.S. Appl. No. 11/470,609 / 20080058619: Oct. 9, 2008 Non-final office action, 29 pages.
U.S. Appl. No. 11/470,615 / 20080097183: Jan. 5, 2010 Final office action, 23 pages.
U.S. Appl. No. 11/470,615 / 20080097183: Feb. 16, 2010 Examiner interview summary, 3 pages.
U.S. Appl. No. 11/470,615 / 20080097183: Apr. 5, 2010 RCE with amendment, 16 pages.
U.S. Appl. No. 11/470,615 / 20080097183: Apr. 25, 2008 Preliminary amendment, 41 pages.
U.S. Appl. No. 11/470,615 / 20080097183: Jun. 19, 2009 Non-final office action, 50 pages.
U.S. Appl. No. 11/470,615 / 20080097183: Sep. 9, 2009 Amendment, 23 pages.
U.S. Appl. No. 11/539,164 / 20080086519: Apr. 28, 2008 Preliminary amendment, 51 pages.
U.S. Appl. No. 11/539,165 / 20080084924: Apr. 17, 2008 Preliminary amendment, 16 pages.
U.S. Appl. No. 11/618,613 / 20080161674: Apr. 17, 2008 Preliminary amendment, 16 pages.
U.S. Appl. No. 11/678,004 / 20080205505: Apr. 21, 2008 Preliminary amendment, 21 pages.
U.S. Appl. No. 11/678,479 / 20080205523: Apr. 21, 2008 Preliminary amendment, 20 pages.
U.S. Appl. No. 11/777,130 / 20090019070: Jan. 11, 2010 Amendment, 11 pages.
U.S. Appl. No. 11/777,130 / 20090019070: Feb. 1, 2010 Notice of allowance, 21 pages.

U.S. Appl. No. 11/777,130 / 20090019070: Apr. 22, 2009 Preliminary amendment, 9 pages.
U.S. Appl. No. 11/777,130 / 20090019070: Apr. 30, 2010 Issue fee payment, 2 pages.
U.S. Appl. No. 11/777,130 / 20090019070: Oct. 14, 2009 Non-final office action, 20 pages.
U.S. Appl. No. 11/777,230 / 20090019071: May 5, 2009 Preliminary amendment, 9 pages.
U.S. Appl. No. 11/777,239 / 20090016452: Apr. 30, 2009 Preliminary amendment, 7 pages.
U.S. Appl. No. 11/777,256 / 20090016453: May 5, 2009 Preliminary amendment, 7 pages.
U.S. Appl. No. 12/246,392 / 20100085218: Dec. 30, 2009 Non-final office action, 6 pages.
U.S. Appl. No. 12/246,392 / 20100085218: Apr. 30, 2010 Amendment, 9 pages.
U.S. Appl. No. 12/246,409 / 20100085224: Dec. 30, 2009 Notice of allowance, 38 pages.
U.S. Appl. No. 12/246,409 / 20100085224: Mar. 30, 2010 RCE, 3 pages.
PCT/US2006/035002 / WO2007/030702 Sep. 13, 2007 International search report and written opinion, 8 pages.
Notice of Allowance and Notice of Allowability dated Jun. 1, 2010 in co-pending U.S. Appl. No. 12/246,409, 21 pages.
Notice of Allowance and Notice of Allowability dated Jun. 10, 2010 in co-pending U.S. Appl. No. 12/246,392, 32 pages.
Response to Office Action filed Jun. 30, 2010 in co-pending U.S. Appl. No. 12/246,426, 10 pages.
Office Action dated May 27, 2010 in co-pending U.S. Appl. No. 12/246,426, 28 pages.

* cited by examiner

COMBINATORIAL CODING/DECODING WITH SPECIFIED OCCURRENCES FOR ELECTRICAL COMPUTERS AND DIGITAL DATA PROCESSING SYSTEMS

BACKGROUND

1. Field

The present description relates to data compression, and more specifically data compression utilizing combinatorial coding within electrical computers and digital data processing systems. Subject matter described herein may relate to processes or apparatus for transferring data from one or more peripherals to one or more computers or digital data processing systems for the latter to process, store, and/or further transfer and/or for transferring data from the computers or digital data processing systems to such peripherals. Subject matter described herein may relate to processes or apparatus for interconnecting or communicating between two or more components connected to an interconnection medium a within a single computer or digital data processing system. Subject matter described herein may relate to processes or apparatus for transferring data from one computer or digital processing system to another computer or digital processing system via a network or other interconnection medium.

2. Information

In recent years it has become common for persons to share data over networks; however, transmission of data has a cost in terms of bandwidth utilization. Therefore, large amounts of data, for example, are often compressed. Compression may also be used, for example, in storing data on magnetic or other media, in transferring data from one component to another within a computing platform, and/or in transferring data to and/or from a peripheral device to and/or from a computing platform.

BRIEF DESCRIPTION OF THE DRAWINGS

Subject matter is particularly pointed out and distinctly claimed in the concluding portions of the specification. Claimed subject matter, however, both as to organization and the method of operation, together with objects, features and advantages thereof, may be best understood by reference to the following detailed description if read with the accompanying drawings in which:

DETAILED DESCRIPTION

Figure 1:
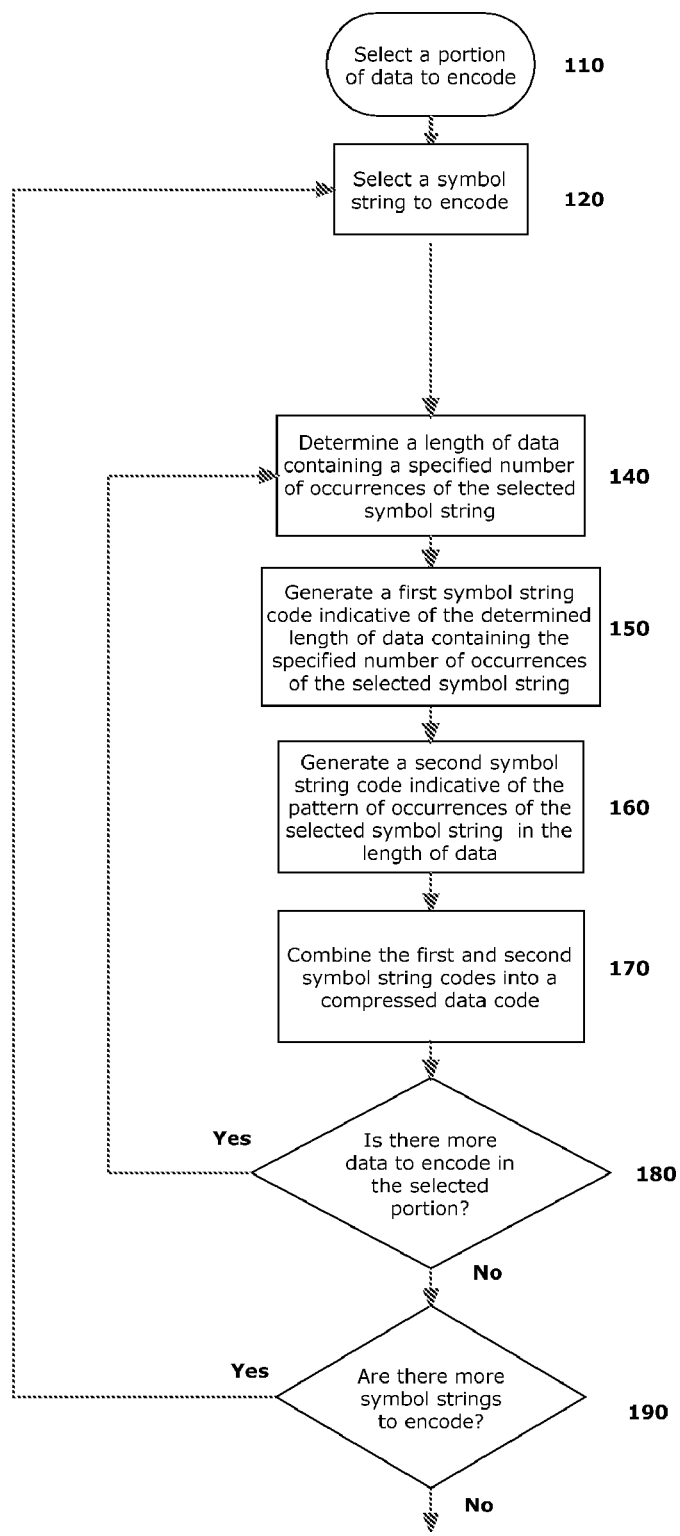
FIG. 1 is a flow diagram illustrating an example embodiment of a combinatorial coding process with specified occurrences.

In the following detailed description, numerous details are set forth in order to provide a thorough understanding of claimed subject matter. However, it will be understood by those skilled in the art that claimed subject matter may be practiced without these specific details. In other instances, well-known methods, procedures, components, and circuits have not been described in detail so as to not obscure claimed subject matter.

Various operations may be described as multiple discrete operations in turn, in a manner that may be helpful in understanding embodiments of claimed subject matter; however, the order of description should not be construed to imply that these operations are order dependent.

For the purposes of the description, a phrase in the form "A/B" means A or B. For the purposes of the description, a phrase in the form "A and/or B" means "(A), (B), or (A and B)". For the purposes of the description, a phrase in the form "at least one of A, B, and C" means "(A), (B), (C), (A and B), (A and C), (B and C), or (A, B and C)". For the purposes of the description, a phrase in the form "(A)B" means "(B) or (AB)" that is, A is an optional element.

For purposes of the description, a phrase in the form "below", "above", "to the right of", etc. are relative terms and do not require that claimed subject matter be used in any absolute orientation.

Reference in the specification to a processing and/or digital "device" and/or "appliance" means that a particular feature, structure, or characteristic, namely device operable connectivity, such as the ability for the device to be execute or process instructions and/or programmability, such as the ability for the device to be configured to perform designated functions, is included in at least one embodiment of the digital device as used herein. Accordingly in one embodiment, digital devices may include general and/or special purpose computing devices, connected personal computers, network printers, network attached storage devices, voice over internet protocol devices, security cameras, baby cameras, media adapters, entertainment personal computers, and/or other networked devices suitably configured for practicing claimed subject matter in accordance with at least one implementation; however these are merely a few examples of processing devices and/or computing platforms to which claimed subject matter is not limited.

The description may use the phrases "in an embodiment," or "in embodiments," which may each refer to one or more of the same or different embodiments. Furthermore, the terms "comprising," "including," "having," and the like, as used with respect to embodiments of claimed subject matter, are synonymous.

Some portions of the detailed description which follow are presented in terms of algorithms and/or symbolic representations of operations on data bits and/or binary digital signals stored within a computing system, such as within a computer and/or computing system memory. These algorithmic descriptions and/or representations are the techniques used by those of ordinary skill in the data processing arts to convey the substance of their work to others skilled in the art. An algorithm is here, and generally, considered to be a self-consistent sequence of operations and/or similar processing leading to a desired result. The operations and/or processing may involve physical manipulations of physical quantities. Typically, although not necessarily, these quantities may take the form of electrical and/or magnetic signals capable of being stored, transferred, combined, compared and/or otherwise manipulated. It has proven convenient, at times, principally for reasons of common usage, to refer to these signals as bits, data, values, elements, symbols, characters, terms, numbers, numerals and/or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing", "computing", "calculating", "determining" and/or the like refer to the actions and/or processes of a computing platform, such as a computer or a similar electronic computing device, that manipulates and/or transforms data represented as physical electronic and/or magnetic quantities and/or other physical quantities within the computing platform's processors, memories, registers, and/or other information storage, transmission, and/or display devices.

Embodiments described herein relate to encoding data comprising symbol strings into one or more compressed data codes. In one implementation, a first portion of a compressed data code may represent a length of data containing a specified number of occurrences of a selected symbol string while a second portion of the compressed data code may represent a pattern of occurrences of the symbol string. However, this is merely an example embodiment and claimed subject matter is not limited in this respect.

Combinatorial Coding

FIG. 1 illustrates an embodiment of a combinatorial encoding process with specified occurrences. Although claimed subject matter is not limited in scope in this respect, one particular embodiment of a method of compressing data is described hereinafter. Action 110 illustrates that, in one embodiment, a portion of data may be selected to encode. In some embodiments, this may facilitate the portioning of long data sequences into more manageable or efficient portions for example. Action 120 illustrates that, in one embodiment, selection of a symbol or symbol string occurring within a portion, block, set, and/or grouping of data to be compressed. Throughout this discussion a specified number of occurrences of a selected symbol string may be called r. In other embodiments, actions 110 and 120 may be performed in a different order and claimed subject matter is not limited by the order in which these actions are performed. Action 140, in one embodiment determines, a length of data which contains a specified number of occurrences of a selected symbol string. Throughout this discussion, a length of data which contains a specified number of occurrences of a selected symbol string may be called n.

Below is discussed how, in some embodiments, n may be determined if there are not as many as r occurrences of a selected symbol string code in a selected portion of data. Also discussed is how, in some embodiments, n may be chosen if a range of lengths are available. Action 150 illustrates generation of a first symbol string code indicative of a determined length of data containing a specified number of occurrences of a selected symbol string. Action 160 illustrates generation of a second symbol string code indicative of a pattern of occurrences of the selected symbol string code in the length of data. Throughout this discussion, a second symbol string code indicative of a pattern of occurrences of a selected symbol string code may be called s. Action 170 illustrates combination of first and second symbol string codes into a compressed data code. Circumstances may arise as discussed below under which a compressed data code may not require a second symbol string code. Such a circumstance may arise if there are either zero or one possible patterns of occurrences of a selected symbol string code in a length of data. Action 180 illustrates that, in one embodiment, all or part of a compression technique may be repeated for additional groupings of data. Action 190 illustrates that, in one embodiment, all or part of a compression technique may be repeated for additional symbols or symbol strings of data. In an embodiment, with long sequences of data which have been partitioned into shorter portions and/or blocks, the process illustrated by FIG. 1 may be repeated with additional portions of data. Respective symbol string codes may then be combined to form a data code. Here, such a data code comprises a compressed form of a set or grouping of data. In one implementation, a compressed data code may be provided for each portion and/or block to provide a plurality of associated compressed data codes. In various embodiments, this data code may be transmitted or stored as desired.

In at least some embodiments described, compression may be lossless, although claimed subject matter is not limited in scope in this respect. For example, in some embodiments, a compressed data code may include information on positions of those symbol strings contained within the data to be compressed.

In one embodiment, illustrated technique may operate particularly well with a small number of occurrences 'r' of a symbol string and may result in short groupings or blocks of data of length 'n'. In various embodiments, it may be particularly suitable if data comprises a sequence of binary digits in which two states occur, such as, for example, 'on' and 'off', or 'red' and 'green' or 'guilty' and 'not guilty' and/or the like. Such binary data may in particular embodiments be represented as a series of the digits '0' and '1', for example.

Accordingly illustrated techniques may be used, in various embodiments, to encode runs or patterns of binary data and may be, in some instances, a viable alternative to previously known methods such as arithmetic coding or Golomb coding. It may also in suitable circumstances be preferred to a Combinatorial Coder disclosed by Monro in USPTO patent application Ser. No. 11/777,256 and filed on Jul. 12, 2007. Such suitable circumstances may exist if the probabilities of occurrence of the binary symbols, e.g. '0' and '1' are greatly different, e.g., if one binary symbol is much more frequent than the other.

Illustrated techniques are not, however, restricted to binary coding and one particular embodiment may be diverted to encode a sequence of different data symbols as will be described.

In one embodiment, a number of occurrences 'r' of a symbol string may be specified or selected or otherwise determined at 130. In some embodiments, this may facilitate portioning of long data sequences into more manageable or efficient portions. In one embodiment, data, such as information stored as a file, a record or other unitary association of data, as one example, might be treated as a whole, or instead partitioned or divided into convenient lengths, long enough for symbol groupings, referred to here as symbol strings, to be encoded with some amount of compression efficiency, but short enough to be processed conveniently. However, these are merely a few considerations that may be used to determine the portioning of the uncompressed data, and claimed subject matter is not limited by these illustrative examples.

Action 120 illustrates that, in one embodiment, a symbol and/or symbol string that occurs within a block, set, or grouping of data may be selected to be compressed. In one embodiment, symbols may comprise any type, form or format of data. For example, symbols may include items, such as, for example, records, files, sectors, clusters, groupings, and/or portions thereof. Furthermore, in other embodiments, symbols may comprise words, bytes, bits, text, characters, and/or the like. However, these are merely a few illustrative examples of symbols to which claimed subject matter is not limited. In one embodiment, symbol strings may comprise single or multiple symbols. Conversely, in other embodiments, such symbol strings may be fixed or variable in length.

In this particular context, any grouping, set, block, and/or portion of associated data to be compressed may be treated as an ordered sequence of characters or other symbols. If, in one embodiment, such data is representative of text, for example, individual symbols may comprise one or more text characters, but, of course, claimed subject matter is not limited in that respect. In other embodiments many other symbols may also be represented. Symbols may be presented by bytes or other sized groupings of data, in various embodiments. It is also possible that, in some embodiments, longer or short portions of data could be used, which may or may not fit within a byte or digital word length, for example. If in a particular embodiment data is represented in binary form, a symbol could be represented, depending on the particular embodiment, as a single bit or multiple bits of fixed or variable length.

For one particular embodiment, symbol strings may be selected for encoding in a particular or a substantially predetermined order, although, again, this is merely an example embodiment and claimed subject matter is not limited in scope in this respect. Alternatively or in addition, rather than encoding in an order, in another embodiment, symbol strings may be encoded in any order. In such an embodiment a symbol string code may be prefixed by some other code indicative of the particular symbol string, for example, although claimed subject matter is of course not limited in scope to this example embodiment. Likewise, for one particular embodiment, the approach employed may be switchable between modes, such as a mode in which symbol string codes are transmitted or stored in a predetermined order, and a mode in which such an order is not predetermined, but in which, in this latter mode, some code representative of a corresponding symbol string is transmitted before or as part of a symbol string code.

Furthermore, in various embodiments, side or additional information about all or some symbol strings may also be included in the compressed data code. In one particular embodiment, additional information relating to a particular symbol string may be transmitted at the end of or otherwise associated with a corresponding symbol string code. Alternatively, in another embodiment, additional information may be transmitted or stored after transmitting or storing symbol string codes. More generally, in various embodiments, additional information may be provided at any time or in any manner to cause a decoder to associate that information with a corresponding symbol string. In one embodiment, a list or table of symbol strings to be used may be predetermined or predefined, for example. Alternatively or in an additional embodiment, it may be compiled based at least in part on symbol strings which occur in data to be compressed, for example.

Initially, for example, in one particular embodiment, a list or table of symbol strings that may occur within a set of data may be established. Added to this list might be, in one embodiment, an initial list of symbol strings based at least in part on a priori knowledge or information regarding statistics for the data. For example, for an embodiment involving text, a common symbol string might comprise "ee", frequently occurring words such as "and" or "or", or a punctuation symbol followed by a blank, to provide some simple examples. Of course, claimed subject matter is not limited in scope to these examples or to this particular embodiment. Many possible variations are also intended to be included within the scope of claimed subject matter.

In another embodiment, a particular set of data, as another example, might be examined before encoding begins to identify symbol strings that occur commonly. Alternatively, or in addition, if partitioning is applied, these partitions, for example, may be handled separately or independently using an initial list of symbol strings. This initial list may have been determined, for example, at least in part from symbol strings which may have been found in earlier data partitions, for example.

Alternatively, symbol strings may be added as coding proceeds, as occurs in Lempel-Ziv-Welch (LZW) coding, as an example. However, in one embodiment example, encoding symbol strings, as described below, may be different from the approach used in LZW encoding. In LZW, a symbol string is encoded by substitution of another, longer symbol or string. For that reason, LZW may, at times, not compress sets of data and, in some cases, may produce longer sets of data. In contrast, embodiments in accordance with claimed subject matter may result in compression.

As illustrated by Action 140, to compress a grouping or a set of data, a first symbol string may be selected from a list of available symbol strings. Occurrences of that string in the data are located. Positions of the first symbol string within the data are retained. This process, in one embodiment, may be then repeated for additional symbol strings for the data so as to specify the set or grouping. Data comprising symbol strings may be processed in any order, although sequentially from beginning to end of the set or grouping of data may be one convenient approach.

In particular implementations, encoding may be carried out by a hardware or software coder. In one possible embodiment, an encoder may be arranged to transmit data, after being coded, across a communications channel to a decoder which may be arranged, in real time or otherwise, to use received coded data to reconstruct the set of data. For a particular embodiment, coded data may be transferred between components in a computing platform.

Figure 2:
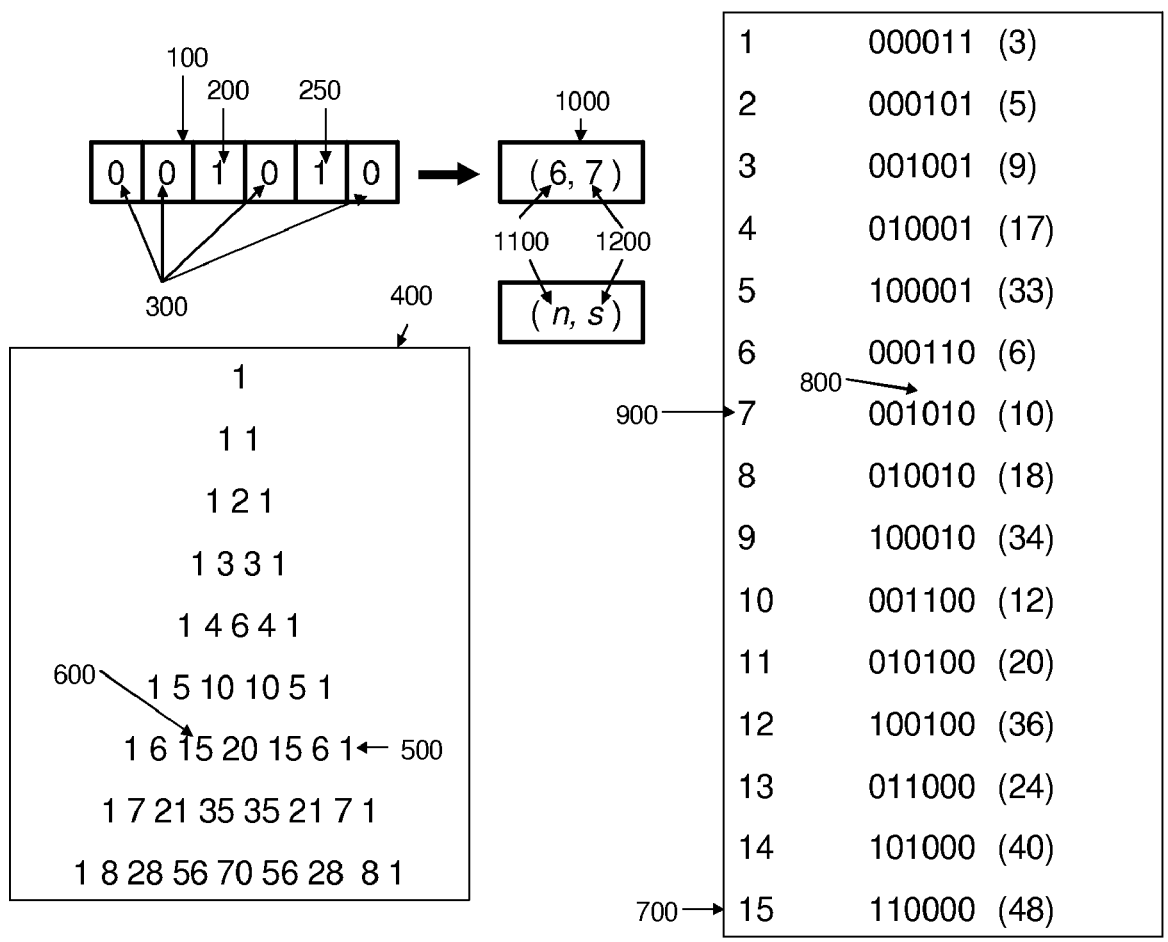
FIG. 2 is a diagram illustrating an example embodiment of a combinatorial coding scheme with specified occurrences.

Again, claimed subject matter is not limited in scope to a particular embodiment. Therefore, the embodiments described previously or hereinafter are intended simply as examples for purposes of illustration. Many other approaches and/or embodiments are intended to be included within the scope of claimed subject matter other than these specific examples. Nonetheless, continuing with these examples, reference is now made to FIG. 2. FIG. 2 is a schematic diagram of one potential embodiment in accordance with claimed subject matter.

First Example

FIG. 2 illustrates one specific, non-limiting, illustrative first example embodiment involving a process of encoding a sequence of six binary bits 100 in which the symbol '1' occurs twice, at 200 and 250, although any number of occurrences might be used and claimed subject matter is not limited in that respect. Of course, claimed subject matter is not limited to this example embodiment or to any one particular embodiment. This example is simply an illustration for explanatory purposes. Many other potential embodiments are intended to be included within the scope of claimed subject matter.

The binary sequence 100 includes a pattern which contains '0' symbols in certain positions 300 and '1' symbols in other positions 200 and 250. In one embodiment, a desired number of occurrences of a first symbol string code (hereafter 'r') may be specified and by examining sequence, 100, a length 'n' or 'run' of data may be determined which contains exactly r occurrences of the symbol string '1'. In this embodiment, an encoder may examine sequence 100 and in particular determine that there are two '1' symbols at positions 200 and 250 in the grouping of six bits. In one implementation, the data may be scanned for the shortest length of data containing two occurrences of the symbol string, in which case in the chosen example n would be five. There may be a particular advantage in choosing n=5 in this example as will be discussed below. Alternatively the data might be scanned for a longer length of data with exactly two occurrences of the symbol string '1', for example n=6 in the example of FIG. 2. In this example, the longest length of data may or may not be six with exactly two occurrences of the symbol string, and claimed subject matter is not so limited.

Continuing with the example of FIG. 2, and taking n as six, although there are $2^6=64$ different patterns of six bits there is a certain lesser number of possible patterns or combinations of six bits which include exactly two '1' bits. This lesser number is much less than 64. Here, fifteen possible combinations of six bits which include exactly two '1' bits may be expressed as $_6C_2=15$. The Table of numbers 400 is well known as Pascal's triangle, and lists all the values of $_nC_r$ for row n from zero to eight with r counting across each row starting from zero. Each number in the triangle is the sum of the two immediately above it, and the sum of the numbers across row n is $2^n$, i.e. the number of different patterns of n bits. To encode sequence 100, the number of '1' bits is 2 and a length of data containing exactly 2 bits is 6. From the seventh row of Pascal's triangle 400, it is seen at 600 that there are fifteen patterns corresponding to r=2.

Action 160 illustrates that, in one embodiment, a second symbol string code selected as one of fifteen possible patterns (hereafter '$s_{15}$') indicative of occurrences of a symbol string code may be generated. The fifteen possible patterns of six bits (which include exactly two '1' bits) are listed in table 700, Here, a seventh pattern 800 corresponds with sequence 100. A code for sequence 100 is therefore the two symbols 1000 which are (6, 7), or in general (n, $s_{15}$) for the case where there are fifteen possible patterns of n bits with exactly two '1's.

It is understood that various indexes s may be assigned to possible combinations or patterns of the n bit blocks which include exactly r occurrences of a selected symbol. In one embodiment, both decoder and encoder may know such an index assignment a priori. Alternatively, in other embodiments data indicative of an index assignment may accompany the compressed data. Or, in yet another embodiment, each index may be independently derived. However, these are merely a few non-limiting examples of ways to assign index values to the combinations, and claimed subject matter is not limited in this respect.

Code to describe this data is in two parts at symbols 1000, a first symbol n 1100 that represents six and a second symbol $s_{15}$ 1200 that represents seven. This code may contain fewer than six bits and if so, the sequence 100 is compressed by symbols 1000. In various embodiments, symbols selected, per action 120 of FIG. 1 and described above, may comprise non-binary or larger binary symbols than illustrated by this specific, non-limiting, illustrative example of FIG. 2.

Returning to the example of FIG. 2, it is evident that the choice of n may to some degree be open. However, there may be some advantage to choosing the shortest run n that contains the specified r occurrences of the symbol '1'. Starting from the beginning of the sequence with r=2 and scanning forward to the '1' bits at 200 and 250, the shortest run is five in this example. If a decoder was aware that the shortest n would always be chosen, then it may be concluded that the final symbol would be a '1', which reduces the number of possible patterns. Knowing that there are r '1' symbols in a run of n symbols, and that the last symbol is '1', the second symbol string code s may specify a pattern of n−1 bits containing r−1 '1' symbols. If the final symbol of n were always '1', then there would always be $_{n-1}C_{r-1}$ possible patterns instead of $_nC_r$, which is always less—sometimes substantially less—as can be seen from the Pascal triangle of FIG. 2. In the example of FIG. 2, if the first symbol string code n is taken as five, then the second symbol string code would specify a pattern of four bits with one '1' bit, and there are only four possible patterns $s_4$. If all patterns are equally likely or substantially equally likely as may often be the case, $\log_2(4)=2$ bits may be used to encode the pattern $s_4$. This is substantially less than the $\log_2(15)=3.91$ bits to encode $s_{15}$ when n is six as in the first example given with this data. Therefore, in many embodiments of a combinatorial encoder with specified occurrences, it may be advantageous to choose n as the shortest sequence of data containing r occurrences to achieve this reduction in the cost of encoding the bit pattern.

However it will be evident to one skilled in the art that there may be situations where there are fewer than the specified r occurrences of the selected symbol string in a block or length of data for which n is to be determined and encoded. This can be dealt with by selecting a value of n that goes beyond the length of data to be encoded. A decoder that knows the length of data can be designed to recognize that a particular symbol string code n may carry it beyond such a length and interpret the code accordingly.

If the specified value of r were five for example, then coding n as five greater than the length of data to be encoded could indicate in an embodiment that there were no occurrences of the symbol string. The pattern s in this case is not necessary because a decoder would deduce that there are no occurrences of the selected symbol string within the data to be encoded. Similarly a value of n that was four greater than the length of data to be encoded would indicate that there was one occurrence of the symbol string within the data. The pattern s needs only to specify where the one occurrence in n−4 symbols lies, and so on. If the encoded n does not exceed the length of data to be encoded, then at least the specified r occurrences of the selected symbol string are available within the data.

This method of dealing with this situation is one of many possible methods of coding n if there are insufficient specified occurrences r of a selected symbol string, and claimed subject matter is not so limited. Nevertheless the present example employs this method to illustrate further the operation of claimed subject matter.

In some embodiments, a final occurrence of a selected symbol string may be a final position of a data length determined at 140 in FIG. 1. A final symbol in this first example embodiment based on FIG. 2 has been left unencoded. To encode this symbol, an encoder may move on from symbol 5 at 250, and attempt to determine a data length n which contains the specified r occurrences. In the present example, r is two, but there are no '1' bits to code. In this present example to continue beyond symbol 5, 250, determining the first symbol string code n to be three would carry the coding past the final symbol in the data sequence by two positions, which is precisely the number needed to make up the specified r=2 '1' symbols. Furthermore the decoder can be arranged to detect this condition, and so in this example there is no need for a pattern to be specified. The decoder knows that the two '1' symbols are beyond the end of the data, so that the only possible pattern for symbol 6 of the data is '0'. Here, accordingly, an encoder may be adapted to encode beyond a data length determined at 140 if there are fewer than a specified number of occurrences of a select symbol string present in the data length.

As described above, in various embodiments, encoder and decoder may store lists of patterns s for different lengths of sequences n and different numbers r of a selected symbol ('1' bit in the example above) within these sequences. Alternatively, in other embodiments, such an encoder and decoder may have access to such lists or have the capability of generating such lists or selected portions of such lists. Here, for example, there may be $2^n$ different patterns of the data but only $_nC_r$ patterns with r bits, which is often less than $2^n$. The illustrated technique may utilize the fact, that $_nC_r$ is always less than $2^n$, to achieve compression. In various embodiments, lists of patterns may be ordered in any convenient way which enables an encoder and decoder to select the same pattern s. Alternatively, in other embodiments, such lists of patterns may be calculated by a coder or decoder as utilized. The described technique may be referred to as combinatorial encoding because it is based on selecting ordered combinations to describe the positions of symbol strings in data, in this illustrative case shown by FIG. 2 the symbol string being the binary digit '1'. This particular technique differs from the combinatorial encoder disclosed by Monro in U.S. patent application Ser. No. 11/777,256. In a particular implementation, a number of occurrences r of a symbol string may be specified and a length of data n containing exactly r occurrences may be determined and used as a first part of a code. In the aforementioned U.S. patent application Ser. No. 11/777, 256, the length of data n to be encoded may be specified and a number of occurrences r of a symbol string may be determined and used as a first part of a code. In both cases an index s is used as a second part of the code to select a pattern of n symbol containing r occurrences of the selected symbol string. In at least some embodiments described herein, an additional advantage may be gained if n is the shortest length of data containing the r specified occurrences, as discussed above.

Equally, in other illustrative embodiments, an encoder and decoder may work with '0' bits, and may specify that n−r of such bits are to be encoded. A first code may comprise the identical value of n and the second code would indicate a pattern with n−r '0' bits. The number of patterns with n−r bits is $_nC_{n-r}$ which is always the same as $_nC_r$, as can be seen from the symmetry of Pascal's triangle 400 in FIG. 2. Compression achieved is exactly the same although of course the ordering of the $_nC_r$ pattern codes 's' may be different if encoding the occurrences in the data of '0' rather than '1'. If n is the shortest value of n with n−r '0' bits, then selection can be made from $_{n-1}C_{n-r-1}$ patterns which has again the same number of patterns as an equivalent $_{n-1}C_{r-1}$ if encoding '1' bits.

The data length n may, in one embodiment, be encoded at 150 efficiently by various techniques such as, for example, Huffman, Golomb, hybrid Huffman/Golomb as taught by Monro in U.S. patent application Ser. No. 11/422,316, arithmetic coding or any other method. In some embodiments a hybrid Huffman/Golomb encoder may outperform Huffman encoding in some circumstances, and may even approach the efficiency of Huffman encoding with probability distributions that are ideal for Huffman encoding. As such a hybrid Huffman/Golomb encoder is of low complexity, it may be used to encode the data length n in an embodiment, although claimed subject matter is not limited in this respect.

In one embodiment, the pattern number s may similarly be encoded at 160 by various techniques such as, for example, Huffman, Golomb, hybrid Huffman/Golomb, arithmetic coding, or any other method including methods as yet undiscovered. It is a feature of various embodiments of the illustrated technique that once n and rare known, all the $_nC_r$ or $_{n-1}C_{r-1}$ possible patterns are equally likely, as long as the probability of occurrence of a '1' bit is uniform. In embodiments where $_nC_r$ is a power of two, an encoder may do no better than code s by $\log_2(_nC_r)$ bits. Sometimes this may occur, and sometimes $_nC_r$ may be just less than a power of two. In both these instances, as they arise, an encoder, in one embodiment, may simply use $\log_2(_nC_r)$ bits (perhaps rounded up) without further encoding. Efficient encoding of $_nC_r$ equally probable outcomes if $_nC_r$ is not a power of two may be difficult or inconvenient in some instances.

Theory—Combinatorial Coding of Binary Data

The mathematics in the binary case or embodiment may prove instructive. Working with '1' as an encoded digit, let the probability of occurrence of a '1' be a constant value q over both long and short blocks of binary data, i.e. q is stationary. In an embodiment, the theoretical cost, or entropy, of encoding of each bit from this data is known to those skilled in the field to be $$e_q(1) = -q \log_2(q) - (1-q)\log_2(1-q)$$

In a block of n bits the probability of each combination of r bits which are '1' may be expressed as $q^r(1-q)^{n-r}$. There are $_nC_r$ possible patterns of r bits from n, so that the probability $p_q(r)$ of having exactly r bits which are '1' in a block of n bits is calculated by multiplying by the number of combinations, $$p_q(r) = _nC_r q^r(1-q)^{n-r}$$

The entropy, or theoretical cost of coding the block of n bits of data by an efficient method considers all the possible values of r:

$$e_q(n) = -\sum_{r=0}^{n} p_q(r)\log_2 p_q(r) \text{ bits.}$$

Embodiments of encoders disclosed herein may consider different patterns that might occur. There may be $_nC_r$ possible patterns of r bits from n, where each is equally likely. The theoretical cost of using the technique described herein here can be calculated, in one embodiment, as the cost of encoding a value of the block or run length n and the cost of transmitting/storing the selected pattern s. An advantage may be gained in some embodiments by specifying not only the number of '1' bits which is called r, but also by specifying that the block length n is the shortest length of data containing r '1' bits, i.e. that the final bit of the run is a '1' bit. There are therefore r−1 '1' bits in the preceding n−1 bits of the block, and the number of combinations or patterns of those is $_{n-1}C_{r-1}$. Because each pattern of r bits is equally probable, encoding the pattern number s by a perfect method may cost $\log_2(_{n-1}C_{r-1})$ bits. The probability of each pattern of r bits in a block of n is still $q^r(1-q)^{n-r}$, so that the probability $p_q^*(n)$ of having exactly r bits which are '1' in a block or run of n, while specifying that the final bit is a '1', is calculated by multiplying the probability of each pattern, $q^r(1-q)^{n-r}$, by the number of possible patterns or combinations, $$p_q^*(n) = _{n-1}C_{r-1} q^r(1-q)^{n-r}$$

Using the probability of each value of n, and summing over all possible values of n, the theoretical cost of using the method to code n bits if the number of '1' bits is specified as r is $$e_q^*(n) = -\sum_{k=r}^{n} p_q^*(k)\log_2(p_q^*(k)) + \sum_{k=r}^{n} p_q^*(k)\log_2(_{k-1}C_{r-1})$$

Those skilled in the field may recognize the first summation in the above equation as the cost of sending n and the second summation as the cost of coding the pattern s. By writing a computer program it can be verified that $e_q*(n)=e_q(n)$, i.e. that an embodiment is capable of perfect encoding provided the encoding of n and s are perfect.

The technique illustrated is therefore capable of perfect compression performance for embodiments or instances where q is stationary. Exactly the same result would be obtained in embodiments where Action 120 of FIG. 1 resulted in using '0' as the binary digit whose occurrences are counted.

In the above theoretical discussion $n \geq r$, although in practice situations may arise when there are fewer than r occurrences available for any value of n. Means of dealing with this will be described further in examples to follow.

In other embodiments, occurrences of more lengthy and/or complex symbol strings may be sought. As described below, such symbol strings may comprise a fixed, predefined form, or alternatively, may comprise symbol strings having flexibility, such as, in form, length, and/or composition, for example. In various embodiments, the extent of flexibility may be predefined or it may be calculated with some dependence at least in part upon some characteristic or characteristics of the data. Some further example symbol strings are set out below and may include one or more of:

- any letter, symbol or character a, such as, for example, "x" (This may include a single symbol position);
- any bigraph $a_1 a_2$, such as "st";
- any combination $a_1 a_2 a_3$, such as "str"; or
- any longer combination $a_1 a_2 a_3 \ldots a_n$, such as "st___ng" where the underscores represent single symbol positions.

In one embodiment, illustrated by Action 190 of FIG. 1, after positions of a first symbol string have been determined, positions of a second symbol string in a list of possible or known symbol strings may be determined.

Gradually, in this manner, a set of data may, in one embodiment, be encoded. As encoding proceeds, an encoder may communicate to a decoder information about symbol strings that have been located, such as position(s), in real time for some embodiments. Alternatively in other embodiments, encoded data may be stored locally as a compressed representation.

In one example embodiment, a process for encoding may be expressed in pseudo-code as follows:

```
For A = Symbol Strings
    Indicate N = Length of data with R occurrences of A
    Indicate the pattern S of R Occurrences in Length N
End
```

Second Example

As a further illustrative, non-limiting, second example embodiment, consider a short sequence S of eight symbol strings S1 to S8. A method of encoding by selecting symbol strings and indicating their positions in a sequence of data by run length coding is known as MERGE coding as described in D. M. Monro, X. Wang, W. Huo, and A. N. Evans, 'Merge coding of atoms for wavelet/matching pursuits image compression', Proc. IEEE Int. Conf. Acoustics, Speech, Signal Process. (ICASSP 2007), Hawaii, April 2007, and is the subject matter of co-pending U.S. patent application Ser. No. 10/572,121. For purposes of illustration, symbol strings here may comprise a fragment of text, although claimed subject matter is not limited in scope in this respect. Such fragments may be short and, furthermore, symbol strings may not comprise text at all and still be within the scope of claimed subject matter. A space between the two words also comprises a symbol string in this example, as illustrated below:

| S: 'the test' | | | | | | | |
|---|---|---|---|---|---|---|---|
| S1 | S2 | S3 | S4 | S5 | S6 | S7 | S8 |
| t | h | e | 'space' | t | e | s | t |

Deliberately in this second example embodiment the letters chosen are among the most common ones to occur in English text. Of course, claimed subject matter is not limited to this example embodiment or to any one particular embodiment. This example is simply an illustration for explanatory purposes. Many other potential embodiments are intended to be included within the scope of claimed subject matter.

Also deliberately in this second example a specified number of occurrences r is used to illustrate again the advantage of choosing a shortest data length n that contains r occurrences, and what is done towards the end of a data sequence if there are insufficient occurrences of a symbol string to make up the specified r occurrences.

In this second example, the symbol 'h' is selected as the first symbol string for encoding. There is one occurrence of 'h' in the eight symbols of this particular example. Therefore, to indicate that there is only one occurrence of 'h' which is insufficient to satisfy the specified value of r=2, the first symbol string code is taken as n=9. This may tell a decoder in this embodiment that there is only one occurrence of 'h', and the second symbol string code s will indicate the pattern of data, in this case a selection of one of the eight possible patterns of 1 'h' among eight symbols which may be called $s_8$. By reference to FIG. 2 in table at 400, it can be seen that $_8C_1$ is eight. There are eight possible patterns, all equally probable, and therefore having a theoretical cost of $\log_2 8$ bits, i.e. three bits. It is always the case that $_nC_1$ is n.

As previously, an encoder and decoder may, in this second illustrative example embodiment, either have a table of all eight possible patterns of one bit among eight, or, in another embodiment, this particular pattern may be generated and identified. There are many possible methods of ordering the $_nC_r$ possible patterns of r bits from n, and claimed subject matter is not limited to any particular method of encoding the pattern s. It is emphasized once more that this does not differ fundamentally from the binary situation. Positions not occupied by 'h' could all be considered to be '0' if encoding positions occupied by 'h' as '1'. The pattern sought for 'the test' is therefore 0100 0000, and there may be a number $s_8$ identifying this pattern which depends on the order in which the patterns are stored or generated. The code for 'h' in this second example embodiment is therefore $(9, s_8)$.

Encoding, in this second example embodiment, may then move on to 'space' and similarly encode it by $(9, s_8)$, and then encode 's' by $(9, s_8)$. For all of the symbols encoded so far in this second example embodiment, the first symbol string code is 9, which is one longer than the length of the data to be encoded. As before, a first symbol string which is one longer than the length of the data to be encoded indicates that there is one less occurrence of the symbol string than the specified value of r. Specifically, one occurrence occurs in length eight even though the specified number r is two. The first symbol string code is therefore 9. By this means it is seen that the encoder can operate effectively if this situation occurs.

At this point all the symbols occurring once have been encoded, and there remain symbols 'e' and 't'. The next one selected may be 'e' in which case there are two occurrences. An encoder seeks a length n which contains r=2 occurrences of 'e' for each symbol string code pair it generates. The symbol string 'e' is in positions three and six. The first symbol string code for this pair of symbol strings 'e' could be any value of n from six to eight. However applying the convention that the shortest length n is selected, the first symbol string code would be 6 and the second symbol string code would select a pattern of one bit from 5, i.e. $s_5$. It is then necessary to carry the coding two positions beyond the end of the data by sending a first symbol string code n=4, which indicates that the position is carried two positions beyond the end of the data. A decoder in such an embodiment can deduce that there are no 'e' symbol strings in positions seven and eight, so that there is no pattern to transmit.

Alternatively a different embodiment may send other than the shortest possible value of n, for example here n=8 which would bring the position to the end of the data. The number of patterns of two positions among eight however is $_8C_2$, which is 28 and the second symbol string code will be $s_{28}$. Two alternative codes for 'e' are therefore firstly (6, $s_5$) followed by (4, $s_0$) where $s_0$ may not be sent, or secondly (8, $s_{28}$).

It may depend on statistics of the encoding task and methods chosen to encode n and s whether one of these is more efficient than the other. There is a third feasible code for 'e' which one skilled in the art will recognize as (7, $s_{21}$) followed by (3, $s_0$). Any one of these codes might be used in embodiments and claimed subject matter is not limited to these or any other choices.

Returning to the second example embodiment, an encoder then moves to the symbol 't' which occurs three times, at positions 1, 4, and 8. Recalling that the number of occurrences is specified as r=2, this may illustrate the use of one symbol string code pair for the first r=2 specified occurrences of 't', and a second symbol string code taking the encoding to the end of the data in which there is only one 't' occurring. To encode the first two occurrences of 't', the first symbol string code could be any value of n from 4 to 7, because all of those lengths contain two occurrences of 't'. For convenience the shortest value is taken, although claimed subject matter is not limited to any particular choice of n where several are available. The decoder may know from n=4 that position 4 is a 't', so that a pattern code $s_3$ may select one of the three possible patterns of one position from three.

Having encoded the specified r=2 occurrences of 't', the encoder is now at position 5 in the data, and by encoding n=5 the encoder may indicate that there is one further occurrence of a 't', because n=5 carries it one position beyond the end of the data. Also, no second symbol string code s is required by an intelligent decoder because there is only one possible pattern of one position occupied among one possible position for the final 't'. Therefore a possible code for 't' is (4, $s_3$) followed by (5, $s_0$).

To summarize, in this second example embodiment the complete code is h: (9, $s_8$)
space: (9, $s_8$).
s: (9, $s_8$)
e: (6, $s_5$) followed by (4, $s_0$)
t: (4, $s_3$) followed by (5, $s_0$).

In the above examples, the encoding of a symbol string ends if the end of the data is reached exactly or indicated by over-running the end of the data in cases where there are insufficient occurrences of a symbol string to provide the specified r occurrences. There are a number of alternative methods of determining a condition where a symbol string has been encoded, and claimed subject matter is not limited to any particular method of indicating or detecting the end of processing of a symbol string, and the commencement of processing a new symbol string. Nevertheless, a method using an 'escape' or ESC symbol is described below. Also, Monro in co-pending U.S. patent application Ser. Nos. 11/777,022, 11/777,100 and 11/777,130 teaches several methods of detecting the end of processing of a symbol string. In an embodiment, several methods of indicating or detecting the end of processing of a symbol string and the commencement of processing a new symbol string could be employed. Claimed subject matter is not limited to these or any other method of indicating or detecting the end of processing of a symbol string and the commencement of processing a new symbol string.

In other embodiments, symbols to be encoded could have been selected in any order, and at this point in the explanation of the presently illustrated embodiment no particular method of selection has been shown to be preferred; however it will now be shown that the order of selection can affect compression performance, in various embodiments.

In one embodiment, compression may be improved still further by a method analogous to "significance switching". More specifically, here, for each successive symbol string that is encoded, remaining positions to be encoded become fewer as the positions of more and more symbol strings become determined. This additional information regarding position may be employed to provide additional compression.

It is noted that, in some instances, as soon as a symbol has been encoded, the number of unknown positions is reduced. In the second illustrative example embodiment above, this can be illustrated by putting 'x' for a known position that can be skipped, '0' for an unknown position and '1' for the positions of the symbol string that is being encoded, as follows:

| 0100 0000 | 0x01 0000 | 0x0x 0010 | 0x1x 01x0 | 1xxx 1xx1 |
|-----------|-----------|-----------|-----------|-----------|
| Scan for h | Scan for space | Scan for s | Scan for e | Scan for 't' |

Third Example

An advantage may be gained in a third illustrative example embodiment by taking account of the reduction in the number of unknown data positions, by skipping over known positions if n is determined and the pattern s is encoded, again specifying r=2 for the purposes of illustration.

In encoding 'h' in this third example illustrative embodiment, no positions are previously known so that there is no difference in the encoding. Therefore to indicate that there is only one occurrence of 'h' which is insufficient to satisfy the specified value of r=2, the first symbol string code is taken as n=9 as before. This may tell a decoder in this embodiment that there is only one occurrence of 'h', and the second symbol string code $s_8$ may indicate a selection of one of the eight possible patterns of one 'h' among eight symbols.

However, in moving on to coding 'space', both an encoder and decoder may know, in this third illustrative example embodiment, that there are only seven unknown positions. To indicate that there is only one occurrence of 'space' in these seven positions, the encoder uses n=8 so that the selected pattern can be based on one bit from the seven unknown bits, i.e. one pattern from $_7C_1$=7 may be selected by $s_7$. The theoretical cost of this is therefore reduced to $\log_2 7=2.8$ bits from the three bits that it was in the second illustrative embodiment. There is no such thing as 0.8 of a bit, of course, but on average in a long message it may be possible to achieve this by using an efficient method of encoding s. Similarly in encoding 's', there are six unknown positions but only one occurrence of 's', so n=7 is coded. A number of combinations from which to select the pattern may be reduced again to $_6C_1=6$, with a theoretical cost of $\log_2 6=2.6$ bits compared with three bits in the second illustrative example embodiment.

A large advantage of this Skipping approach can now be seen in encoding the two occurrences of 'e'. There are now five unknown positions, with the second 'e' as the fourth of these. To encode the two positions of 'e', n is encoded as 4, and one of $_3C_1=3$ patterns is to be selected with an expected cost of $\log_2 3=1.6$ bits. Compared to the previous second illustrative example embodiment in which the data length was always eight, this has been reduced from five patterns which would have cost an expected $\log_2 5=2.3$ bits. It remains necessary to move to the end of the data to indicate the end of processing of the symbol string 'e', for which there is only one unknown position. Encoding n=3 may indicate that there are no more 'e' symbols by moving the position two places beyond the end of the data, followed in principle by $s_0$, which as in all embodiments may not be transmitted as it is always one. In the second illustrative example embodiment previously, this was indicated by n=4 followed by $s_0$, so an additional advantage may have been gained here, which would, however, depend on the statistics of n in the two embodiments.

An even larger advantage may be now gained. Assuming the encoder and decoder, in this particular embodiment, know that they have now reached the final symbol string, and that it is 't', then the cost of encoding the three occurrences of 't' is zero bits. Of course some method of knowing this is advantageous, as will be explained below.

The advantage of this Skipping approach with r=2 is clear from the summary below:

|  | Code | Theoretical s Cost without 'Skipping' (Second example embodiment) | Theoretical s Cost with 'Skipping' (Third example embodiment) |
| --- | --- | --- | --- |
| h | 9, $s_8$ | 3 | 3 |
| space | 8, $s_7$ | 3 | 2.8 |
| s | 7, $s_6$ | 3 | 2.6 |
| e | 4, $s_3$, 2, $s_0$ | 2.3 | 1.6 |
| t | — | 1.6 | 0 |

This of course is a very simple, non-limiting, third illustrative example embodiment. In other embodiments, an encoder may choose symbol strings for encoding in order to reduce the cost of encoding the pattern selection s. In the example given this may be by encoding the rarest symbols first but in a real application a more complex approach may be justified. This may not be a consideration in coding binary data because the number of '0' patterns is always the same as the number of '1' patterns for any given value of the first code r, because the number of patterns with n−r bits is $_nC_{n-r}$ which is always the same as $_nC_r$.

However with more than two symbols, it may become important to minimize the cost of sending the pattern selection s. However, it is advantageous in some embodiments to consider how the selection of symbol strings for encoding might be made.

A set of symbol strings may be, in one embodiment, evaluated with respect to a set of data in some order which may or may not be predetermined. Suppose, for the purpose of illustration, as an example embodiment, symbol strings here have predetermined order 'e' 't' 'a' 'o' 'i' 'n' 's' 'h' 'r' 'd' 'space' 'l' 'u', Apart from the position assigned to 'space' this corresponds to the frequency of letter normally encountered in English text. After 'space' there are a further sixteen letters to consider of which only the first two are shown here, although, of course, claimed subject matter is not limited in scope to this example or to any particular example.

Fourth Example

Symbol String Jumping

For this particular fourth example embodiment, a technique is desired to indicate that there are no instances of a symbol string. One way of doing this, in a particular embodiment, would be to encode n as zero whenever a symbol string does not occur. In the previous third illustrative example embodiment (in which the data block is the phrase "the test" and skipping of previously determined position has been used), and taking the symbol strings in this different order, the code becomes:

(6, $s_5$), (4, $s_0$), 0. 0. 0. 0. (4, $s_3$), (3, $s_2$), 0, 0, (2, $s_1$), 0, 0

In doing so, while it may be reasonable to encode n=0 to jump over a reasonable number of symbol strings, the advantage of ordering the symbols to reduce a total cost of transmitting s for each symbol string has been lost. Instead, one embodiment may take symbols in REVERSE order, becoming . . . 0, 0, 0, (9, $s_8$), 0, 0, (8, $s_7$), (7, $s_6$), 0, 0, 0, 0, (3, $s_2$), (3, $s_2$), (2, $s_1$), (2, $s_0$)

(space) (h) (s) (t) (e)

Or, omitting the 'e' as being the final symbol

. . . 0, 0, 0, (9, $s_8$), 0, 0, (8, $s_7$), (7, $s_6$), 0, 0, 0, 0, (3, $s_2$), (3, $s_2$)

(space) (h) (s) (t)

In instances where data is sparse, there may be many empty symbol string groups, and it can be wasteful to send a long sequence of the r=0 codes to indicate successive empty symbol string groups.

In one embodiment, a further symbol may be used in the symbol string code positions where n is expected, which we may call ESC1. ESC1 may always be followed by a symbol j indicating an integer value, which may represent a number of symbol strings to jump. If j were 0, no symbol strings may be skipped. A value of j>0 may, in this embodiment, jump forward through the symbol string sequence and a value of j<0 may, in one embodiment, move through the symbol string sequence backwards. Continuing the previous example (in which the data block is the phrase "the test"), and assuming that the text which is being coded consists only of the twenty-six letters of the English alphabet plus 'space', it is noted that when scanning the symbols in reverse order of frequency of occurrence in normal English, sixteen are not used. The example can therefore be prefixed by ESC1 16. The example embodiment with ESC1 used in place of multiple values of r=0 is:

ESC1, 16, (9, $s_8$), ESC1, 2, (8, $s_7$), (7, $s_6$), ESC1, 4, (3, $s_2$), (3, $s_2$)

(space) (h) (s) (t)

Assuming it is better however to code 'e' before 't', the embodiment could use ESC1 to jump backwards:

ESC1, 16, (9, $s_8$), ESC1, 2, (8, $s_7$), (7, $s_6$), ESC1, 4, (4, $s_3$), (3, $s_0$)

(space) (h) (s) (e)

ESC1 could also be used, in one embodiment, to jump to the end of a list of symbols, or in the case where the order is not predetermined, two ESC1 symbols in a row could be used, in one embodiment, to indicate that the encoding is finished, allowing a decoder to fill out any unknown positions with the final symbol string selected. ESC1 may, in one embodiment, provide a mechanism for jumping through a predetermined list of symbol strings. There are many variations that could be used, and the subject matter is not to be limited to any particular effect of ESC1. It is also understood that ESC1, may be represented by any symbol or indication and is not limited to a particular encoding.

In further embodiments, a further Escape symbol ESC2 could be introduced to occur in the positions where either or both of n or ESC1 are expected, after which a symbol string could be given explicitly. This could be used with or without a predetermined order of selecting symbol strings. In embodiments, without a predetermined order ESC 2 could be inserted before every symbol string is encoded to specify the symbol string that comes next. If used with embodiments with a predetermined order ESC2 could be used to take a symbol string out of order, after which the scanning might, in some embodiments, continue in order, of after which the scanning might return to the next symbol string it might have taken had the ESC2 not been given. ESC2 may be used in some embodiments as a mechanism for forcing a particular symbol string to be selected. There are many variations that could be used, and the subject matter is not to be limited to any particular effect of ESC2. It is also understood that ESC2 may be represented by any symbol or indication and is not limited to a particular encoding.

Any form or type of encoding to encode the values of n or s or ESC1 or j or ESC2 and claimed subject matter is not limited to a particular form or type. For example in some embodiments, a Huffman coder, a Golomb coder, a binary arithmetic coder, or other methods including those as yet undisclosed might be employed, to provide a few examples. Of course, these are simply examples and claimed subject matter is not limited in scope to such examples.

Symbol String Selection

It is possible that, in one embodiment, if the end of a symbol string group is determined by whichever method, the decoder may not know what the next symbol string is to be. Such as, for example if the sequence of symbol strings to be coded has not been predetermined. In one embodiment, the identity of the new symbol might be encoded as soon as the end of group occurs. This however is but one possibility and the method is not to be limited in this respect. For example, in one embodiment, an entire communication could be carried out without knowing what the symbol strings are. In one such embodiment, the decoder may simply assign its own choice of temporary tokens to be substituted with actual symbol strings at some future time.

However, it may also be desirable in some circumstances to employ a similar approach if the length of a set of data and/or number of symbol strings is not known. Various approaches may be possible in situations where a length of a set of data being encoded, for example, is not known and claimed subject matter is not limited in scope to a particular approach. For example, in one embodiment, this might be handled by having a standard length. Alternately in another embodiment, length information may be prefixed to coded information. However, if multiple sets of data are being coded and most have the same length, to prefix length may be inefficient from a compression standpoint. Likewise, continuing with this notion, for a long communication of data, if a standard length is employed to sub-divide the data, variation from a standard length may, in one embodiment, be handled by communicating or encoding a set of data at the end smaller than the standard length.

One embodiment of the technique may include partitioning the total length of a data set before encoding. If there is a standard partition length, an encoder and decoder may determine how many partitions there are, and the length of final partition if it is less than the standard length. For example in one embodiment, if a set of data 102 symbol strings long is being coded and the standard length of a partition is five, then twenty-one partitions are present with the final one having a length of two. Again, as previously discussed, a total length may be included in the data code in many ways and the examples given are not intended to be restrictive. Claimed subject matter is intended to include these example approaches as well as other possible approaches.

Likewise, several approaches are also possible with respect to handling symbol strings. For example, as previously illustrated, in one embodiment, a predetermined order of symbol strings may be employed. However, alternately, symbol strings may be ordered relative to their frequency of occurrence if known or capable of being determined or approximated. For example, using English simply as an illustrative example, this might the following order: 'e' 't' 'a' 'o' 'i' 'n' 's' 'h', or indeed the reverse of this order, and so on. A "space" may be included in such order as its statistics indicate in a sample. Also, there may be symbol strings that do not occur, which may form an empty symbol string group to be signalled. With such an approach, both an encoder and a decoder may determine an order of symbol strings.

Another approach may include an embodiment in which encoders explicitly prefix a set of data, for example, with a symbol string. Likewise in other embodiments, a symbol string may alternately be post-fixed or otherwise embedded so that a decoder may make appropriate determinations from encoded data. It is likewise possible that, in other embodiments, a system may employ two modes, one in which a predetermined order of symbol strings is communicated and another in which symbol strings are prefixed or otherwise embedded. These modes could occur in any order and mode switching may be indicated, in one embodiment, by a special symbol used for that purpose.

In still another possible embodiment, an encoder and decoder may adopt a method of constructing new symbol strings from symbol strings already received. This level of flexibility may permit an encoder to select or change symbol strings and modes of communication to improve compression. In an example embodiment, it might well be the case that not all predefined symbol strings are used, in which case, to avoid signalling a large number of empty groups by repeating the ESC1 j symbols, there might be a new symbol string which signals "No More Groups" or "End of Data", for example. This possibility was introduced above as was the possibility that two successive occurrences of the ESC1 symbol might serve this purpose.

In some embodiments, side information might accompany a data set. For example, in the case of text, font, size, weight, colour and/or style might comprise such side information. This may be communicated or encoded any number of ways. In one embodiment, side information may be inserted in encoded data in any position so that a decoder may appropriately associate it with a symbol string. In another embodiment, it might be desirable to handle side information combined with a symbol string as a symbol string itself, hence forming additional groups. For example, an italic 'e' may form a separate symbol string from normal 'e', as one simple example. Likewise, in an embodiment, a special symbol may be employed to switch between different embedding styles or approaches, if desired.

Embodiments in accordance with claimed subject matter may be applied to encoding of data of all types, including non-numeric data, such as symbolic data, for example, converted into numerical form by any convenient mapping prior to application of encoding. As is noted, some embodiments may perform well for run length encoding, although it will, of course, be understood that claimed subject matter is not limited to that application. It is intended that embodiments of claimed subject matter be applied to any one of a number of different types of data encoding. Therefore, claimed subject matter is not intended to be limited in terms of the type of data to which it may be applied.

Figure 3:
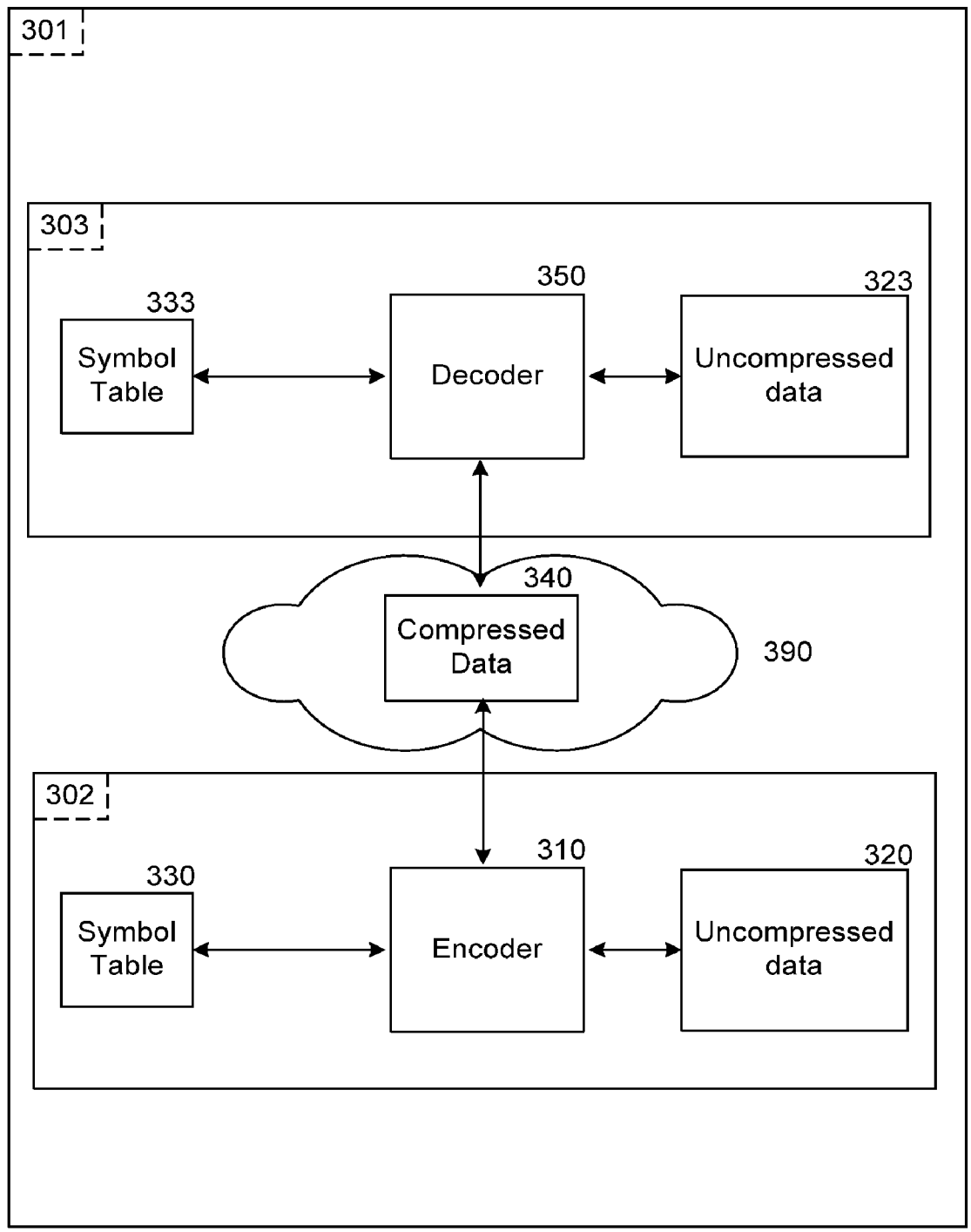
FIG. 3 is a schematic diagram illustrating an example embodiment of a system and an apparatus.

FIG. 3 is a block diagram illustrating an example embodiment of a system 301 comprising an encoding apparatus 302 and a decoding apparatus 303. In one embodiment, the system may include the encoding apparatus, the decoding apparatus and a wireless network 390. Other embodiments may comprise one or more other network types, and/or one or more other interconnection medium.

In one embodiment, encoding apparatus 302 may include an encoder 310 which may be capable of performing the example embodiments described above and illustrated in FIGS. 1 & 2. Encoder 310 may take uncompressed data 320 and encode it, or a portion of it, into compressed data 340. In one embodiment, the encoding may be facilitated by a symbol table 330. In one embodiment, the encoder apparatus may transmit the compressed data to a decoder apparatus. For an embodiment, encoder 310 may comprise a symbol string selector capable of selecting a symbol string to encode, and may also comprise a first symbol string code generator capable of generating a first symbol string code indicative of a length of data containing a specified number of occurrences of the selected symbol string. Encoder 310 may further comprise a second symbol string code generator capable of generating a second symbol string code indicative of the pattern of occurrences of the selected symbol string, as well as a combiner capable of combining the first and second symbol string codes into a compressed data code. However, this is merely an example embodiment of a coder, and the scope of claimed subject matter is not limited in this respect.

In one embodiment, the decoding apparatus 303 may include a decoder 350, which may be capable of performing the reverse of the example embodiments described above and illustrated in FIGS. 1 & 2. Decoder 350 may take compressed data 340 and decode it, or a portion of it, into uncompressed data 323. In one embodiment, the decoding may be facilitated by a symbol table 333. In one embodiment, the decoder apparatus may receive the compressed data from an encoder apparatus.

It is noted, of course, that claimed subject matter is not limited to particular embodiments. Therefore, in addition to covering methods for coding and/or decoding of data, claimed subject matter is also intended to cover, for example, software incorporating such methods and to coders and/or decoders (whether implemented in hardware or software, or a combination of hardware and software). Claimed subject matter is also intended to include a video or audio codec embodying such methods and/or a video or audio compression system whereby data may be encoded according to a method as described or claimed. For example, embodiments may include transmitting data across a communications channel for reconstruction be a decoder at the far end. Likewise, alternatively, in another embodiment in accordance with claimed subject matter coded data may be stored rather than transmitted. Thus, claimed subject matter is intended to cover these as well as other embodiments.

Embodiments described herein are not limited to any particular hardware or software configuration; they may find applicability in any computing or processing environment. Embodiments may be implemented in hardware, software, firmware or a combination thereof. Embodiments may be implemented in programs executing on programmable machines such as mobile or stationary computers, personal digital assistants, and/or similar devices that each include a processor, a storage medium readable or accessible by the processor (including volatile and non-volatile memory and/or storage elements), at least one input device, and one or more output devices. Program code may be applied to data entered using the input device to perform the functions described and to generate output information. The output information may be applied to one or more output devices.

Programs may be implemented in a high level procedural or object oriented programming language to communicate with a processing system. Programs may also be implemented in assembly or machine language.

A program may be stored on a storage medium or device, e.g. compact disk read only memory (CD-ROM), digital versatile disk (DVD), hard disk, firmware, non-volatile memory, magnetic disk or similar medium or device, that is readable by a general or special purpose programmable machine for configuring and operating the machine if the storage medium or device is read by the computer to perform the procedures described herein. The system may also be considered to be implemented as a machine-readable or accessible storage medium, configured with a program, where the storage medium so configured causes a machine to operate in a specific manner. Other embodiments are within the scope of the following claims.

Figure 4:
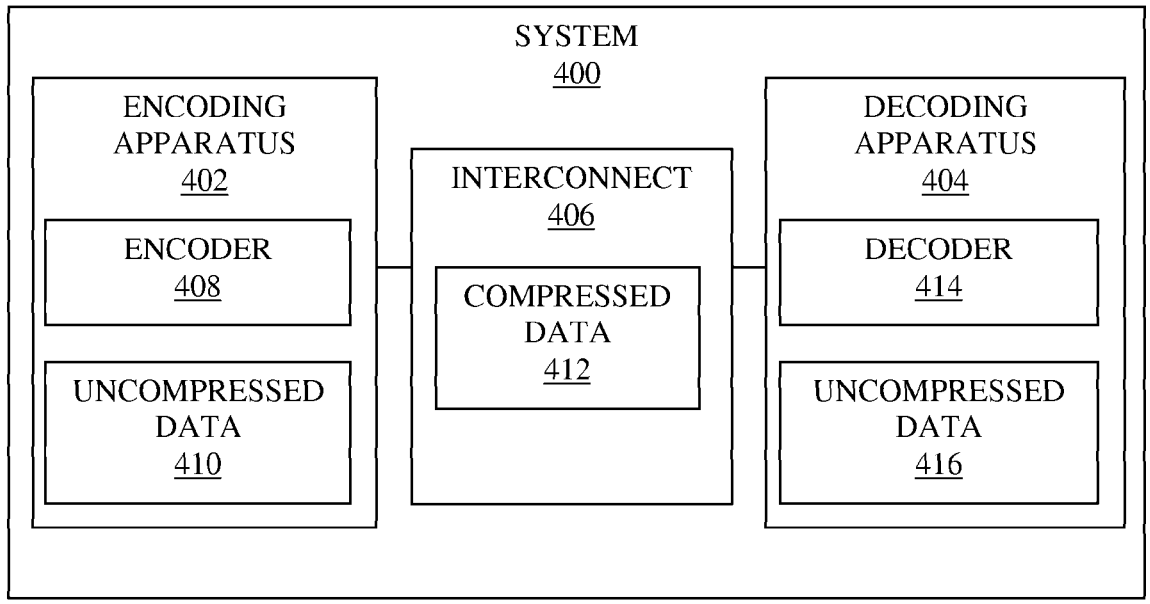
FIG. 4 is a schematic diagram of an example embodiment of a system comprising an encoding apparatus and a decoding apparatus coupled via an interconnect.

FIG. 4 is a block diagram illustrating an example embodiment of a system 400 comprising an example embodiment of an encoding apparatus 402 and a decoding apparatus 404 in accordance with claimed subject matter. In one embodiment, system 400 may include encoding apparatus 402, decoding apparatus 404 and an interconnect 406. An interconnect may comprise, for example, one or more portions of a network, an interconnect between two or more devices in a computing platform, an interconnect between functional units of a device and/or an interconnect between two dies sharing a single package, as just a few examples. For example, system 400 may have encoding apparatus 402 and decoding apparatus 404 located within a single device and performing communications within the device.

In an embodiment, encoding apparatus 402 may include an encoder 408 which may be capable of performing one or more techniques as described above and/or as illustrated in FIGS. 1-3. As part of the technique, encoder 408 may take uncompressed data 410 (e.g., stored in a memory) and encode it, or a portion of it, into compressed data 412. In one embodiment, encoding apparatus 402 may transmit compressed data 412 to decoding apparatus 404, such as within a single device, over an interconnect, and/or the like.

In an embodiment, decoding apparatus 404 may include a decoder 414, which may be capable of performing one or more techniques as described above and/or as illustrated in FIGS. 1-3. As part of the technique decoder 414 may take compressed data 412 and decode it, or a portion of it, into uncompressed data 416. System 400 described above is not limited to any particular hardware or software configuration and all or part of system 400 may find applicability in any computing or processing environment such as is described below in connection with FIG. 5, for example.

Figure 5:
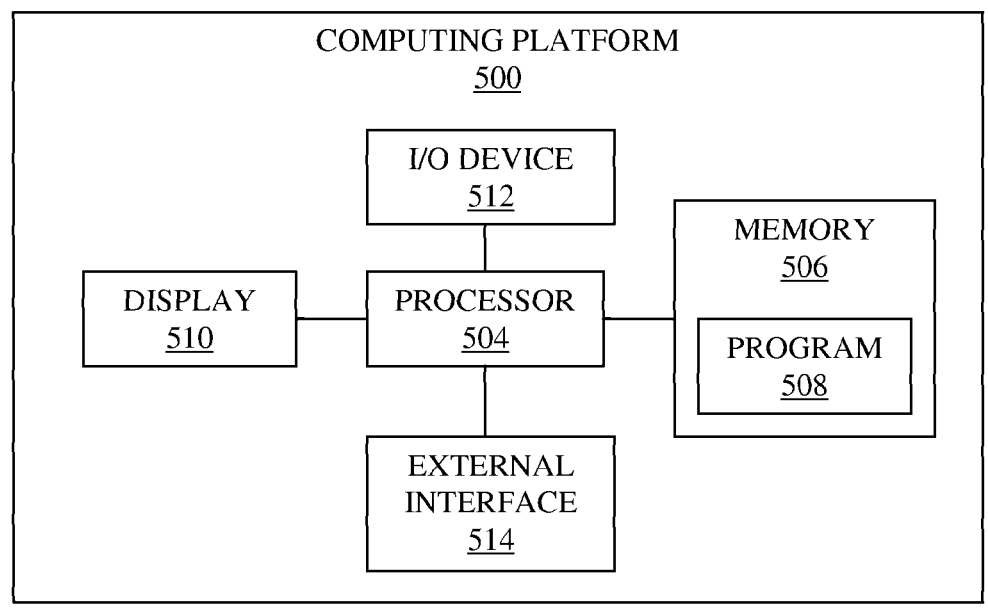
FIG. 5 is a schematic diagram of an example embodiment of a computing platform.

Referring to FIG. 5, a block diagram of an example computing platform 500 according to one or more embodiments is illustrated, although the scope of claimed subject matter is not limited in this respect. Computing platform 500 may include more and/or fewer components than those shown in FIG. 5. However, generally conventional components may not be shown, for example, a battery, a bus, and so on.

Computing platform 500, as shown in FIG. 5 may be utilized to embody tangibly a computer program and/or graphical user interface by providing hardware components on which the computer program and/or graphical user interface may be executed. Computing platform 500 may be utilized to embody tangibly all or a portion of embodiments described herein. Such a procedure, computer program and/or machine readable instructions may be stored tangibly on a computer and/or machine readable storage medium such as a compact disk (CD), digital versatile disk (DVD), flash memory device, hard disk drive (HDD), and so on. As shown in FIG. 5, computing platform 500 may be controlled by processor 504, including one or more auxiliary processors (not shown). Processor 504 may comprise a central processing unit such as a microprocessor or microcontroller for executing programs, performing data manipulations, and controlling the tasks of computing platform 500. Auxiliary processors may manage input/output, perform floating point mathematical operations, manage digital signals, perform fast execution of signal processing algorithms, operate as a back-end processor and/or a slave-type processor subordinate to processor 504, operate as an additional microprocessor and/or controller for dual and/or multiple processor systems, and/or operate as a coprocessor and/or additional processor. Such auxiliary processors may be discrete processors and/or may be arranged in the same package as processor 504, for example, in a multicore and/or multithreaded processor; however, the scope of the scope of claimed subject matter is not limited in these respects.

Communication with processor 504 may be implemented via a bus (not shown) for transferring information among the components of computing platform 500. A bus may include a data channel for facilitating information transfer between storage and other peripheral components of computing platform 500. A bus further may provide a set of signals utilized for communication with processor 504, including, for example, a data bus, an address bus, and/or a control bus. A bus may comprise any bus architecture according to promulgated standards, for example, industry standard architecture (ISA), extended industry standard architecture (EISA), micro channel architecture (MCA), Video Electronics Standards Association local bus (VLB), peripheral component interconnect (PCI) local bus, PCI express (PCIe), hyper transport (HT), standards promulgated by the Institute of Electrical and Electronics Engineers (IEEE) including IEEE 488 general-purpose interface bus (GPIB), IEEE 696/S-100, and so on, although the scope of the scope of claimed subject matter is not limited in this respect.

Other components of computing platform 500 may include, for example, memory 506, including one or more auxiliary memories (not shown). Memory 506 may provide storage of instructions and data for one or more programs 508 to be executed by processor 504, such as all or a portion of embodiments described herein, for example. Memory 506 may be, for example, semiconductor-based memory such as dynamic random access memory (DRAM) and/or static random access memory (SRAM), and/or the like. Other semiconductor-based memory types may include, for example, synchronous dynamic random access memory (SDRAM), Rambus dynamic random access memory (RDRAM), ferroelectric random access memory (FRAM), and so on. Alternatively or additionally, memory 506 may be, for example, magnetic-based memory, such as a magnetic disc memory, a magnetic tape memory, and/or the like; an optical-based memory, such as a compact disc read write memory, and/or the like; a magneto-optical-based memory, such as a memory formed of ferromagnetic material read by a laser, and/or the like; a phase-change-based memory such as phase change memory (PRAM), and/or the like; a holographic-based memory such as rewritable holographic storage utilizing the photorefractive effect in crystals, and/or the like; and/or a molecular-based memory such as polymer-based memories, and/or the like. Auxiliary memories may be utilized to store instructions and/or data that are to be loaded into memory 506 before execution. Auxiliary memories may include semiconductor based memory such as read-only memory (ROM), programmable read-only memory (PROM), erasable programmable read-only memory (EPROM), electrically erasable read-only memory (EEPROM), and/or flash memory, and/or any block oriented memory similar to EEPROM. Auxiliary memories also may include any type of non-semiconductor-based memories, including, but not limited to, magnetic tape, drum, floppy disk, hard disk, optical, laser disk, compact disc read-only memory (CD-ROM), write once compact disc (CD-R), rewritable compact disc (CD-RW), digital versatile disc read-only memory (DVD-ROM), write once DVD (DVD-R), rewritable digital versatile disc (DVD-RAM), and so on. Other varieties of memory devices are contemplated as well.

Computing platform 500 further may include a display 510. Display 510 may comprise a video display adapter having components, including, for example, video memory, a buffer, and/or a graphics engine. Such video memory may be, for example, video random access memory (VRAM), synchronous graphics random access memory (SGRAM), windows random access memory (WRAM), and/or the like. Display 510 may comprise a cathode ray-tube (CRT) type display such as a monitor and/or television, and/or may comprise an alternative type of display technology such as a projection type CRT type display, a liquid-crystal display (LCD) projector type display, an LCD type display, a light-emitting diode (LED) type display, a gas and/or plasma type display, an electroluminescent type display, a vacuum fluorescent type display, a cathodoluminescent and/or field emission type display, a plasma addressed liquid crystal (PALC) type display, a high gain emissive display (HGED) type display, and so forth, although the scope of claimed subject matter is not limited in this respect.

Computing platform 500 further may include one or more I/O devices 512. I/O device 512 may comprise one or more I/O devices 512 such as a keyboard, mouse, trackball, touchpad, joystick, track stick, infrared transducers, printer, modem, RF modem, bar code reader, charge-coupled device (CCD) reader, scanner, compact disc (CD), compact disc read-only memory (CD-ROM), digital versatile disc (DVD), video capture device, TV tuner card, touch screen, stylus, electroacoustic transducer, microphone, speaker, audio amplifier, and/or the like.

Computing platform 500 further may include an external interface 514. External interface 514 may comprise one or more controllers and/or adapters to prove interface functions between multiple I/O devices 512. For example, external interface 514 may comprise a serial port, parallel port, universal serial bus (USB) port, and IEEE 1394 serial bus port, infrared port, network adapter, printer adapter, radio-frequency (RF) communications adapter, universal asynchronous receiver-transmitter (UART) port, and/or the like, to interface between corresponding I/O devices 512. External interface 514 for an embodiment may comprise a network controller capable of providing an interface, directly or indirectly, to a network, such as, for example, the Internet.

In the preceding description, various aspects of claimed subject matter have been described. For purposes of explanation, systems and configurations were set forth to provide a thorough understanding of claimed subject matter. However, these are merely example illustrations of the above concepts wherein other illustrations may apply as well, and the scope of claimed subject matter is not limited in these respects. It should be apparent to one skilled in the art having the benefit of this disclosure that claimed subject matter may be practiced without specific details. In other instances, well-known features were omitted and/or simplified so as to not obscure claimed subject matter. While certain features have been illustrated and/or described herein, many modifications, substitutions, changes and/or equivalents will now occur to those skilled in the art. It is, therefore, to be understood that the appended claims are intended to cover all such modifications and/or changes as fall within the true spirit of claimed subject matter.

What is claimed is:

1. A method comprising:
   determining a length of data containing a specified number of occurrences of a selected symbol string;
   generating a first symbol string code indicative of the determined length;
   generating a second symbol string code indicative of a pattern of occurrences of said selected symbol string; and
   combining said first and second symbol string codes to provide a compressed data code.

2. The method of claim 1, wherein said selected symbol string comprises binary symbols.

3. The method of claim 1, wherein a final occurrence of said selected symbol string is at a final position in said determined length of data.

4. The method of claim 1, and further comprising encoding beyond said length of data if there are fewer than said specified occurrences in said length of data.

5. The method of claim 1, and further comprising encoding a plurality of lengths of data into an associated plurality of compressed data codes.

6. The method of claim 5, and further comprising generating the first and second symbol string code taking account of a number of known symbol strings to be skipped.

7. The method of claim 1, wherein an order of repeated symbol strings comprises one or more of a predetermined order, a dynamically created order based upon previously used symbol strings, an order based upon a frequency of symbol strings in a generalized set and/or an order based upon a frequency of symbol strings in a data set to be compressed.

8. The method of claim 1, wherein said generating said first symbol string code comprises applying an arithmetic, Huffman, Golomb, Huffman/Golomb hybrid or adaptive encoding scheme.

9. The method of claim 1, wherein said generating said second symbol string code comprises applying an arithmetic, Huffman, Golomb, Huffman/Golomb hybrid or adaptive encoding scheme.

10. The method of claim 1, and further comprising:
    partitioning a data set into one or more blocks of data;
    selecting a block of data to compress; and
    generating a compressed data code based on said selected block of data.

11. An article comprising:
    a storage medium comprising machine-readable instructions stored thereon which, if executed by a computing platform, are adapted to direct said computing platform to:
    determine a length of data containing a specified number of occurrences of a selected symbol string;
    generate a first symbol string code indicative of the determined length;
    generate a second symbol string code indicative of a pattern of occurrences of said selected symbol string; and
    combine said first and second symbol string codes to provide a compressed data code.

12. The article of claim 11, wherein said instructions, if executed by said computing platform, are further adapted to direct said computing platform to encode a plurality of lengths of data into an associated plurality of compressed data codes.

13. The article of claim 12, wherein said instructions, if executed by said computing platform, are further adapted to generate the first and second symbol string code taking account number of known symbol strings to be skipped.

14. The article of claim 11, wherein said instructions, if executed by said computing platform, are further adapted to direct said computing platform to generate said first symbol string code by application of an arithmetic, Huffman, Golomb, Huffman/Golomb hybrid or adaptive encoding scheme.

15. The article of claim 11, wherein said instructions, if executed by said computing platform, are further adapted to direct said computing platform to:
    partition a data set into one or more blocks of data;
    select a block of data to compress; and
    generate a compressed data code based on said selected block of data.

16. An apparatus comprising:
    a memory to store uncompressed data; and
    an encoder, said encoder being adapted to:
    determine a length of data from said uncompressed data containing a specified number of occurrences of a selected symbol string;
    generate a first symbol string code indicative of the determined length;
    generate a second symbol string code indicative of a pattern of occurrences of said selected symbol string; and
    combine said first and second symbol string codes to provide a compressed data code.

17. The apparatus of claim 16, wherein said encoder is further adapted to:
    partition a data set of said uncompressed data into one or more blocks of data;
    select a block of data to compress; and
    generate a compressed data code based on said selected block of data.

18. The apparatus of claim 16, wherein said encoder is further adapted to encode a plurality of lengths of data into an associated plurality of compressed data codes.

19. The apparatus of claim 18, wherein said encoder is further adapted to take account of a number of known symbol strings to be skipped.

20. The apparatus of claim 16, wherein said encoder is further adapted to generate said first symbol string code by application of an arithmetic, Huffman, Golomb, Huffman/Golomb hybrid or adaptive encoding scheme.

21. An apparatus comprising:
a decoder, said decoder being adapted to:
partition a compressed data code into first and second symbol string codes,
associate said first symbol string code with a length of data containing a specified number of occurrences of a selected symbol string, and
associate said second symbol string with a pattern of occurrences of said selected symbol string in said length of data,
provide uncompressed data based, at least in part, on said pattern of occurrences and said length of data; and
a memory to store said uncompressed data.

* * * * *